United States Patent
Sheffer et al.

(10) Patent No.: US 10,210,657 B2
(45) Date of Patent: Feb. 19, 2019

(54) METHODS AND SYSTEMS FOR HEX-MESH OPTIMIZATION VIA EDGE-CONE RECTIFICATION

(71) Applicant: The University of British Columbia, Vancouver (CA)

(72) Inventors: Alla Sheffer, Vancouver (CA); Nicholas Vining, Vancouver (CA); Marco Livesu, Cagliari (IT)

(73) Assignee: The University of British Columbia, Vancouver, British Columbia (CA)

(*) Notice: Subject to any disclaimer, the term of this patent is extended or adjusted under 35 U.S.C. 154(b) by 222 days.

(21) Appl. No.: 15/217,956

(22) Filed: Jul. 22, 2016

(65) Prior Publication Data

US 2017/0024931 A1    Jan. 26, 2017

Related U.S. Application Data

(60) Provisional application No. 62/196,894, filed on Jul. 24, 2015.

(51) Int. Cl.
*G06T 17/20* (2006.01)
*G06F 17/16* (2006.01)
*G06F 17/11* (2006.01)

(52) U.S. Cl.
CPC ............ *G06T 17/205* (2013.01); *G06F 17/11* (2013.01); *G06F 17/16* (2013.01)

(58) Field of Classification Search
CPC ....... G06T 17/205; G06T 17/20; G06T 15/04; G06T 15/005; G06T 11/40; G06T 19/20;
(Continued)

(56) References Cited

U.S. PATENT DOCUMENTS

| 4,822,090 A | 4/1989 | Kim |
|---|---|---|
| 4,833,310 A | 5/1989 | Shimamura et al. |

(Continued)

FOREIGN PATENT DOCUMENTS

| EP | 0232115 A2 | 8/1987 |
|---|---|---|
| EP | 0704811 A2 | 4/1996 |

(Continued)

OTHER PUBLICATIONS

Wan, S., Yin, Z., Zhang, K., Zhang, H., and Li, X. 2011. A topology-preserving optimization algorithm for polycube mapping. Computers & Graphics 35, 3, 639-649.

(Continued)

*Primary Examiner* — Xilin Guo
(74) *Attorney, Agent, or Firm* — Oyen Wiggs Green & Mutala LLP

(57) ABSTRACT

Methods and systems improve quality of a hex-mesh by: performing a first iterative procedure which starts with the input hex-mesh and which outputs an output hex-mesh having improved quality. Performing the first iterative procedure comprises: initializing a current hex-mesh to be equal to the input hex mesh; for each iteration of the first iterative procedure: performing an optimization of an energy function over a plurality of directed-edges in the current hex-mesh to determine updated vertex positions for vertices in the current hex-mesh, wherein for each directed edge, the energy function comprises a term that expresses a preference for the directed edge to be aligned with normal vectors of base triangles of an edge-cone corresponding to the directed edge; and updating the current hex-mesh with the updated vertex positions; and after one or more iterations, setting the output hex-mesh to be equal to the current hex-mesh.

24 Claims, 8 Drawing Sheets

(58) Field of Classification Search
CPC ....... G06T 7/11; G06T 17/05; G06T 2200/04; G06T 17/00; G06T 19/00; G06F 17/16; G06F 17/11; G01V 1/48; G01V 1/302; G01V 1/345; G06K 9/6215
See application file for complete search history.

(56) References Cited

U.S. PATENT DOCUMENTS

| | | | |
|---|---|---|---|
| 5,729,670 A | 3/1998 | Strumolo et al. | |
| 5,731,817 A * | 3/1998 | Hahs, Jr. | G06T 17/20 345/420 |
| 5,768,156 A | 6/1998 | Tautges et al. | |
| 6,099,058 A | 8/2000 | Asai et al. | |
| 6,124,857 A | 9/2000 | Itoh et al. | |
| 6,259,453 B1 | 7/2001 | Itoh et al. | |
| 6,446,033 B1 | 9/2002 | Tatsumi et al. | |
| 6,573,892 B1 | 6/2003 | Yang et al. | |
| 6,578,189 B2 | 6/2003 | Hariya et al. | |
| 6,600,487 B1 | 7/2003 | Henn et al. | |
| 6,625,938 B1 | 9/2003 | Shimada et al. | |
| 6,804,635 B1 | 10/2004 | Dhondt et al. | |
| 6,904,395 B1 | 6/2005 | Dejack et al. | |
| 6,999,908 B2 | 2/2006 | Yang et al. | |
| 7,098,912 B1 | 8/2006 | Borden et al. | |
| 7,166,381 B2 | 1/2007 | Choi et al. | |
| 7,181,377 B1 | 2/2007 | Borden et al. | |
| 7,671,858 B1 | 3/2010 | Staten et al. | |
| 7,711,532 B2 | 5/2010 | Dulac et al. | |
| 7,930,154 B2 | 4/2011 | Brusoe | |
| 8,126,234 B1 | 2/2012 | Edwards et al. | |
| 8,150,663 B2 | 4/2012 | Mallet et al. | |
| 8,194,068 B1 | 6/2012 | Staten et al. | |
| 8,200,464 B2 | 6/2012 | Slavik | |
| 2002/0120430 A1 | 8/2002 | Yang et al. | |
| 2002/0144231 A1 | 10/2002 | Hariya et al. | |
| 2003/0056733 A1 | 3/2003 | Niki | |
| 2004/0032408 A1* | 2/2004 | Doi | G06T 17/20 345/420 |
| 2004/0210429 A1 | 10/2004 | Yu et al. | |
| 2006/0139358 A1 | 6/2006 | Cho et al. | |
| 2006/0265169 A1 | 11/2006 | Breister et al. | |
| 2008/0021684 A1 | 1/2008 | Dulac et al. | |
| 2008/0100619 A1 | 5/2008 | Chien et al. | |
| 2008/0189068 A1 | 8/2008 | Brusoe | |
| 2008/0221839 A1 | 9/2008 | Pasino | |
| 2008/0221845 A1 | 9/2008 | Yu et al. | |
| 2008/0246766 A1* | 10/2008 | Yokohari | G06T 17/20 345/423 |
| 2008/0303817 A1 | 12/2008 | Kataoka et al. | |
| 2009/0015586 A1 | 1/2009 | Im et al. | |
| 2009/0112527 A1 | 4/2009 | Mora et al. | |
| 2010/0226589 A1* | 9/2010 | Mukherjee | G06T 17/20 382/264 |
| 2010/0256957 A1 | 10/2010 | Slavik | |
| 2010/0288204 A1 | 11/2010 | Costello et al. | |
| 2010/0290679 A1 | 11/2010 | Gasser et al. | |
| 2012/0038640 A1* | 2/2012 | Lee | G06T 17/005 345/420 |
| 2016/0292902 A1* | 10/2016 | Milne | G06T 9/40 |

FOREIGN PATENT DOCUMENTS

| | | |
|---|---|---|
| EP | 0914909 A2 | 5/1999 |
| EP | 0980049 A2 | 2/2000 |
| EP | 1077431 A1 | 2/2001 |
| EP | 1098208 B1 | 9/2004 |
| EP | 1385103 B1 | 9/2006 |
| EP | 1978487 A2 | 10/2008 |
| EP | 1751585 B1 | 11/2009 |
| EP | 2237175 A1 | 10/2010 |
| EP | 2206086 B1 | 5/2011 |
| JP | 2012198847 | 10/2012 |
| WO | 2002003173 A2 | 1/2002 |
| WO | 2002101659 A2 | 12/2002 |
| WO | 2004072741 A2 | 8/2004 |
| WO | 2005119304 A1 | 12/2005 |
| WO | 2006127632 A2 | 11/2006 |
| WO | 2008094520 A2 | 8/2008 |
| WO | 2009014398 A2 | 1/2009 |
| WO | 2009049681 A1 | 4/2009 |
| WO | 2009050304 A1 | 4/2009 |
| WO | 2009053451 A1 | 4/2009 |
| WO | 2012065619 A1 | 5/2012 |

OTHER PUBLICATIONS

Xu, Y., Chen, R., Gotsman, C., and Liu, L. 2011. Embedding a triangular graph within a given boundary. Computer Aided Geometric Design 28, 6, 349-356.

Gu, X., Gortler, S. J., and Hoppe, H. 2002. Geometry images. ACM Trans. Graph. 21, 3 (July), 355-361.

Kia, J., Garcia, I., He, Y., Xin, S.-Q., and Patow, G. 2011. Editable polycube map for gpu-based subdivision surfaces. In Proc. Symposium on Interactive 3D Graphics and Games, 151-158.

Yang, H., Jin, M., He, Y., Gu, X., and Qin, H. 2008. User-controllable polycube map for manifold spline construction. In Proc. Symposium on Solid and physical modeling, 397-404.

Hoos, H., and Sttzle, T. 2004. Stochastic Local Search: Foundations & Applications. Morgan Kaufmann Publishers Inc., San Francisco, CA, USA.

Hormann, K., and Floater, M. S. 2006. Mean value coordinates for arbitrary planar polygons. ACM Transactions on Graphics 25, 4 (Oct.), 1424-1441.

Ju, T., Schaefer, S., and Warren, J. 2005. Mean value coordinates for closed triangular meshes. SIGGRAPH, 561-566.

Kolmogorov, V., and Zabih, R. 2004. What energy functions can be minimized via graph cuts. IEEE Transactions on Pattern Analysis and Machine Intelligence 26, 65-81.

L'Evy, B., and Liu, Y. 2010. Lp centroidal voronoi tesselation and its applications. ACM Transactions on Graphics Proc. SIGGRAPH).

Li, B., and Qin, H. 2012. Component-aware tensor-product trivariate splines of arbitrary topology. Computers & Graphics.

Li, B., Li, X., Wang, K., and Qin, H. 2010. Generalized poly-cube trivariate splines. In Proc. Shape Modeling International, 261-265.

Praun, E., and Hoppe, H. 2001 Spherical parametrization and remeshing. ACM Trans. Graph. 22, 3 (July), 340-349.

Shamir, A. 2008. A survey on mesh segmentation techniques. Comput. Graph. Forum 27, 1539-1556.

Sheffer, A., Praun, E., and Rose, K. 2006. Mesh parameterization methods and their applications. Foundations and Trends in Computer Graphics and Vision 2, 2, 105-171.

Shepherd, J. F., and Johnson, C. R. 2008. Hexahedral mesh generation constraints. Engineering with Computers 24, 3, 195-213.

Schneiders, R. 1996. A grid-based algorithm for the generation of hexahedral element meshes. Engineering with Computers 12, 168-177.

Marechal, L. 2009. Advances in octree-based all-hexahedral mesh generation: handling sharp features. In Proc. International Meshing Roundtable.

Tautges, T. J., Blacker, T., and Mitchell, S. A. 1996. The whisker weaving algorithm: a connectivity-based method for constructing all-hexahedral finite element meshes. Intl. Journal for Numerical Methods in Engineering 39, 19, 3327-3349.

Miyoshi, K., and Blacker, T. 2000. Hexahedral mesh generation using multi-axis cooper algorithm. In Proc. International Meshing Roundtable, 89-97.

Li, Y., Liu, Y., Xu, W., Wang, W., and Guo, B. 2012. All-hex meshing using singularity-restricted field. ACM Trans. Graph. 31, 6.

Gregson, J., Sheffer, A., and Zhang, E. 2011. All-hex mesh generation via volumetric polycube deformation. Computer Graphics Forum (Proc. SGP 2011).

Livesu, M., Vining, N., Sheffer, A., Gregson, J., and Scateni, R. 2013. Polycut: monotone graph-cuts for polycube base-complex construction. ACM Trans. Graph. 32, 6.

(56) References Cited

OTHER PUBLICATIONS

Huang, J., Jiang, T., Shi, Z., Tong, Y., Bao, H., and Desbrun, M. 2014. L1 based construction of polycube maps from complex shapes. ACM Trans. Graph. 33, 3 (June), 25:1-25:11.

Aigerman, N., and Lipman, Y. 2013. Injective and bounded distortion mappings in 3d. ACM Trans. Graph. 32, 4.

Blacker, T. 2000. Meeting the challenge for automated conformal hexahedral meshing. In Proc. International Meshing Roundtable.

Brewer, M. L., Diachin, L. F., Knupp, P. M., Leurent, T., and Melander, D. J. 2003. The mesquite mesh quality improvement toolkit. in Proc. International Meshing Roundtable.

Cignoni, P., Rocchini, C., and Scopigno, R. 1998. Metro: Measuring Error on Simplified Surfaces. Comput. Graph. Forum 17, 2.

Erickson, J. 2014. Efficiently hex-meshing things with topology. Discrete and Computational Geometry 52, 3, 427-449.

Freitag Diachin, L., Knupp, P., Munson, T., and Shontz, S. 2006. A comparison of two optimization methods for mesh quality improvement. Engineering with Computers 22, 2, 61-74.

Owen, S. 2009. A survey of unstructured mesh generation technology. http://www.andrew.cmu.edu/user/sowen/survey/hexsurv.html.

Knupp, P. M. 2001. Hexahedral and tetrahedral mesh untangling. Engineering with Computers 17, 3, 261-268.

Knupp, P. M. 2003. A method for hexahedral mesh shape optimization. Intl. Journal for Numerical Methods in Engineering 58, 2, 319-332.

Labelle, F., and Shewchuk, J. R. 2007. Isosurface stuffing: fast tetrahedral meshes with good dihedral angles. ACM Trans. Graph. 26.

Nieser M. Reitebuch, U., and Polthier, K. 2011. Cube-Cover—Parameterization of 3D Volumes. Computer Graphics Forum.

Paillé, G.-P., Poulin, P., and L'Evy, B. 2013. Fitting polynomial volumes to surface meshes with Voronoï squared distance minimization. Computer Graphics Forum 32, 5, 103-112.

Pébay, P. P., Thompson, D., Shepherd, J., Knupp, P., Lisle, C., Magnotta, V. A., and Grosland, N. M. 2007. New applications of the verdict library for standardized mesh verifica¬tion pre, post, and end-to-end processing. In Proc. International Meshing Roundtable. 535-552.

Ruiz-Gironés, E., Roca, X., Sarrate, J., Montenegro, R., and Escobar, J. 2014. Simultaneous untangling and smoothing of quadrilateral and hexahedral meshes using an object-oriented framework. Advances in Engineering Software.

Zhang, Y., Bajaj, C., and Xu, G. 2009. Surface smoothing and quality improvement of quadrilateral/hexahedral meshes with geometric flow. Communications in Numerical Methods in Engineering 25, 1, 1-18.

Sastry, S. P., and Shontz, S. M. 2009. A comparison of gradient-and hessian-based optimization methods for tetrahe¬dral mesh quality improvement. In Proc. International Meshing Roundtable.

Sastry, S., and Shontz, S. 2014. A parallel log-barrier method for mesh quality improvement and untangling. Engineering with Computers 30, 4, 503-515.

Schüller, C., Kavan, L., Panozzo, D., and Sorkine-Hornung, O. 2013. Locally injective mappings. Computer Graphics Forum (Proc. SGP) 32, 5, 125-135.

Sorkine, O., and Alexa, M. 2007. As-rigid-as-possible surface modeling. In Proc. SGP, 109-116.

Sun, L., Zhao, G., and Ma, X. 2012. Quality improvement methods for hexahedral element meshes adaptively generated using grid-based algorithm. Intl. Journal for Numerical Methods in Engineering 89, 6, 726-761.

Vartziotis, D., and Himpel, B. 2014. Efficient and global optimization-based smoothing methods for mixed-volume meshes. In Proc. International Meshing Roundtable. 293-311.

Vartziotis, D., and Papadrakakis, M. 2011 Improved GETMe by adaptive mesh smoothing. Computer Assisted Meth¬ods in Engineering and Science, 20, 55-71.

Wilson, T., Sarrate, J., Roca, X., Montenegro, R., and Escobar, J. 2012. Untangling and smoothing of quadrilateral and hexahedral meshes. In Eighth Intl. Conference on Engineering Computational Technology.

Mitchell, Scott A., "Technical History of Hex Mesh Generation", Sandia National Labs, CUBIT Mesh Generation Project, Sep. 15, 2002.

Xia, Jiazhi et al., "Direct-Product Volumetric Parameterization of Handlebodies via Harmonic Fields", 2010 Shape Modeling International Conference.

Ben-Chen M. et al., "Variational Harmonic Maps for Space Deformation", ACM Transactions on Graphics, vol. 28, No. 3, Article 34, Aug. 2009.

Botsch M., Pauly M., Wicke M., Gross M. H.: Adaptive space deformations based on rigid cells. Computer Graphics Forum 26, 3 (2007), 339-347.

Bommes D., Zimmer H., Kobbelt L.: Mixed integer quadrangulation. ACM Trans. Graph. 28,3 (2009), 1-10.

Daniels J. et al., "Semi-regular Quadrilateral-only Remeshing from Simplified Base Domains", In Proc. Symp. on Geom. Proc. (2009), pp. 1427-1435.

Eppstein D. et al., "Steinitz Theorems for Orthogonal Polyhedra", In Proc. Symposium on Computational geometry (2010), SoCG '10, pp. 429-438.

Floater M.S. et al., "Mean value coordinates in 3D", Comput. Aided Geom. Des. 22 (Oct. 2005), 623-631.

He Y. et al. "A Divide-And-Conquer Approach for Automatic Polycube Map Construction", Computers and Graphics 33 (2009), 369-380.

Han S. et al., "Hexahedral Shell Mesh Construction via Volumetric Polycube Map", In Proceedings of the 14th ACM Symposium on Solid and Physical Modeling (New York, NY, USA, 2010), SPM '10, ACM, pp. 127-136.

Kälberer F. et al., "QuadCover—Surface Parameterization using Branched Coverings", Computer Graphics Forum 26,3 (2007), 375-384.

Levy B.: Graphite. http://alice.loria.fr/. Prior to filing date Jul. 22, 2013.

Lin J. et al., "Automatic PolyCube-Maps", In Advances in Geometric Modeling and Processing, (2008), pp. 3-16.

Lavin Y. et al., "The Topology of Three-Dimensional Symmetric Tensor Fields", In Late Breaking Hot Topics IEEE Visualization '96 (1996), CS Press, pp. 43-46.

Levy B. et al., "Lp Centroidal Voronoi Tesselation and its Applications", ACM Trans. Graph. 29, 4, Article 119 (Jul. 2010).

Li X. et al., "Feature-aligned Harmonic Volumetric Mapping using MFS", Computers & Graphics 34 (2010), pp. 242-251.

Muller-Hannemann M., "Shelling Hexahedral Complexes for Mesh Generation", Journal of Graph Algorithms and Applications, vol. 5, No. 5, (2001), pp. 59-91.

Zhou K. et al., "Large Mesh Deformation Using the Volumetric Graph Laplacian", Association for Computing Machinery Inc. (2005), pp. 496-503.

Shepherd J. F., "Topologic and Geometric Constraint Based Hexahedral Mesh Generation", PhD thesis, University of Utah, May 2007.

TetGen, "A Quality Tetrahedral Mesh Generator and Three-Dimensional Delaunay Triangulator" Available online: http://www.tetgen.org. Prior to filing date of Jul. 22, 2013.

Shepherd J. F., "Hexahedral Mesh Generation Constraints", Scientific Computing and Imaging Institute, University of Utah, Feb. 13, 2006.

Staten M. et al., "Unconstrained Paving and Plastering: Progress Update", Sandia Corporation (2006), pp. 469-486.

Sorkine O., "Differential Representations for Mesh Processing", School of Computer Science, Tel Aviv University, vol. 25 (2006), No. 4, 789-807.

Suzuki T. et al., "An Interior Surface Generation Method for All-Hexahedral Meshing", In Proc. International Meshing Roundtable (2005), pp. 377-397.

Tarini M. et al., "PolyCube-Maps", In Proc. SIGGRAPH (2004), pp. 853-860.

(56) References Cited

OTHER PUBLICATIONS

Tournois J. et al., "Interleaving Delaunay Refinement and Optimization for Practical Isotropic Tetrahedron Mesh Generation", ACM Trans. Graph. 28 (2009).
Vyas V. et al., "Tensor-Guided Hex-Dominant Mesh Generation with Targeted All-Hex Regions", In Proc. International Meshing Roundtable (2009), Department of Mechanical Engineering, Carnegie Mellon University.
Wicke M. et al., Dynamic Local Remeshing for Elastoplastic Simulation, ACM Trans. Graph. 29 (Jul. 2010), University of California, Berkeley.
Yu Y. et al., "Mesh Editing with Poisson-Based Gradient Field Manipulation", ACM SIGGRAPH (2004), pp. 1-8.
Yao et al., "Adaptive geometry image", 2008, IEEE Transactions on Visualization and Computer Graphics 14, 4, 348-960.
Yang, H. et al., "Polycube splines", 2007, In Proc. Symposium Solid and physical modeling, 241-251.
Chang, C., et al., "Texture tiling on 3d models using automatic polycube maps and wang tiles", 2010, J. Inf. Sci. Eng. 26, 1, 291-305.
Alice Project-Team. Graphite. http://alice.loria.fr/software/graphite/ (downloaded Jun. 30, 2016).
Bommes, D., Levy, B., Pietroni, N., Puppo, E., Silva, C., Tarini, M., and Zorin, D. 2013. Quad-mesh generation and processing: A survey. Computer Graphics Forum.
Boykov, Y. and Kolmogorov, V. 2001. An experimental comparison of min-cut/max-flow algorithms for energy minimization in vision. IEEE Transactions on Pattern Analysis and Machine Intelligence 26, 359-374.

* cited by examiner

EXAMPLES OF TOPOLOCIALLY CONSECUTIVE EDGES

EXAMPLES OF TOPOLOCIALLY PARALLEL EDGES

METHODS AND SYSTEMS FOR HEX-MESH OPTIMIZATION VIA EDGE-CONE RECTIFICATION

REFERENCE TO RELATED APPLICATIONS

This application claims the benefit of the priority, and the benefit of 35 USC 119(e), of U.S. application Ser. No. 62/196894 which is hereby incorporated herein by reference.

TECHNICAL FIELD

The invention relates to computer-based hexahedral mesh (hex-mesh) modeling of three-dimensional objects. Particular embodiments provide methods and systems for optimizing hex-meshes via edge-cone rectification.

BACKGROUND

Many computer-based engineering models use finite element discretization based models to model and simulate the behavior of three-dimensional objects. A popular choice for many such engineering models involves the use of hexahedral meshes (hex-meshes) as the finite element discretization of choice. Typical, but non-limiting examples of input objects which may be modelled using hex-meshes include: parts of mechanical systems; fluid conduits for fluid simulation; biological elements, such as human bones and/or organs. There is a general desire to provide high quality hex-meshes, since the quality of such hex-meshes can influence the accuracy and/or reliability of the corresponding engineering models. The generation of hex-meshes is typically a two-step process which involves: (i) generating an initial hex-mesh whose connectivity is designed to fit the input object; and (ii) modifying the positions of vertices to optimize the shapes of the mesh elements while keeping the connectivity fixed.

A challenge that is faced by automated (computer-based) hex-mesh generation techniques is that the generated hex-meshes typically contain poorly shaped hexahedrons. For example, poorly shaped hexahedrons may comprise hexahedrons that are relatively far from cuboid in shape and/or hexahedrons that are inverted or concave in shape. Even a single inverted (concave) hexahedral element can render an entire hex-mesh representation unusable for simulation. Hex-meshes comprising such poorly shaped hexahedrons may be referred to as low quality hex-meshes and individual poorly shaped hexahedrons within such hex-meshes may be referred to as low quality hexahedrons or low quality elements. There is a general desire for automated computer-based techniques for improving the quality of hex-meshes (e.g. hex-mesh representations of input objects). Such hex-mesh improvement techniques may improve the average quality of the hex-mesh elements and/or the minimum quality of the hex-mesh elements and may be referred to as hex-mesh optimization techniques.

The foregoing examples of the related art and limitations related thereto are intended to be illustrative and not exclusive. Other limitations of the related art will become apparent to those of skill in the art upon a reading of the description and a study of the drawings.

BRIEF DESCRIPTION OF DRAWINGS

Exemplary embodiments are illustrated in referenced figures of the drawings. It is intended that the embodiments and figures disclosed herein are to be considered illustrative rather than restrictive.

SUMMARY

Figure 1:
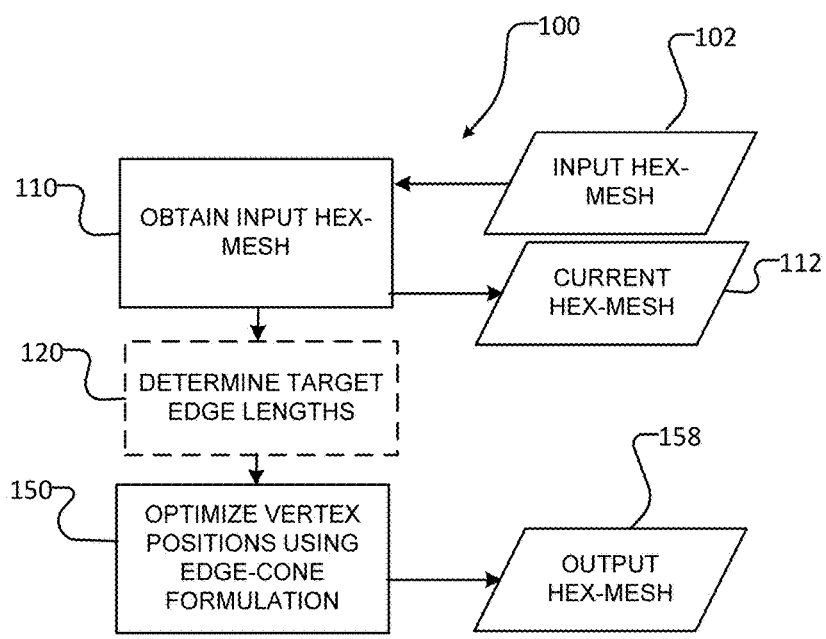
FIG. 1 schematically illustrates an automated (computer-implemented) method for optimizing (i.e. improving the quality of) an input hex-mesh to generate an improved quality output hex-mesh according to a particular embodiment.

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

The invention provides a number of non-limiting aspects. Non-limiting aspects of the invention comprise the following:

1. A method, performed by a computer, for improving quality of a hex-mesh, the method comprising:
    obtaining an input hex-mesh;
    performing a first iterative procedure which starts with the input hex-mesh and which outputs an output hex-mesh having improved quality relative to the input hex-mesh;
    wherein performing the first iterative procedure comprises:
        initializing a current hex-mesh to be equal to the input hex mesh;
        for each iteration of the first iterative procedure:
            performing an optimization (e g minimization) of an energy function over a plurality of directed-edges in the current hex-mesh to determine updated vertex positions for vertices in the current hex-mesh, wherein for each directed edge, the energy function comprises a term that expresses a preference for the directed edge to be aligned with normal vectors of base triangles of an edge-cone corresponding to the directed edge; and updating the current hex-mesh with the updated vertex positions; and after one or more iterations, setting the output hex-mesh to be equal to the current hex-mesh.

2. A method according to aspect 1 or any other aspect herein wherein, for each directed edge extending from a base vertex $v_i$ to an end vertex $v_j$:

the edge-cone corresponding to the directed edge comprises a plurality of tetrahedra surrounding the directed edge, each of the plurality of tetrahedra bounded by the directed edge and by a pair of distinct edges of a hexahedron in the current hex-mesh mesh, each of the pair of distinct edges emanating from the base vertex $v_i$ and not including the end vertex $v_j$;

the base triangles of the edge-cone corresponding to the directed edge comprise, for each tetrahedron of the plurality of tetrahedra, the triangular surface of the tetrahedron which includes the base vertex $v_i$ but does not include the end vertex $v_j$.

3. A method according to any one of aspects 1 and 2 or any other aspect herein wherein, for each directed edge, the term of the energy function that expresses the preference for the directed edge to be aligned with normal vectors of base triangles of the edge-cone corresponding to the directed edge has the form of $$\sum_{t_k \in T(e_{ij})} \left( \frac{e_{ij}}{\|e_{ij}\|} - n_k \right)^2,$$

as described above in connection with equation (2).

4. A method according to any one of aspects 1 to 3 or any other aspect herein comprising, for each directed edge, at least one of:

determining the normal vectors of the base triangles corresponding to the directed edge according to an equation having the form of equation (4) described above; and obtaining target edge lengths for the output hex-mesh and determining the normal vectors of the base triangles corresponding to the directed edge according to an equation having the form of equation (6) described above.

5. A method according to aspect 4 or any other aspect herein wherein obtaining target edge lengths for the output hex-mesh comprises one or more of: receiving the target edge lengths for the output hex-mesh; using the edge-lengths of the input hex-mesh as the target edge lengths for the output hex-mesh; and estimating the target edge lengths for the output hex-mesh.

6. A method according to aspect 5 or any other aspect herein wherein obtaining target edge lengths for the output hex-mesh comprises estimating the target edge lengths for the output hex-mesh and estimating the target edge lengths for the output hex-mesh comprises performing an edge-length optimization which optimizes (e.g. minimizes) an edge-length energy function over a plurality of edges in either the input hex-mesh or the current hex-mesh.

7. A method according to aspect 6 or any other aspect herein wherein the edge-length energy function comprises a first term which expresses a preference for at least some of the plurality of edges to have target edge lengths that are similar to the average edge length of the plurality of edges.

8. A method according to any one of aspects 6 to 7 or any other aspect herein where the edge-length energy function comprises a surface term which expresses a preference for at least some of the plurality of edges on a boundary surface to have target edge lengths that are similar to their original edge lengths.

9. A method according to any one of aspects 6 to 8 or any other aspect herein where the edge-length energy function comprises a topologically parallel term which expresses a preference for at least some topologically parallel edges to have target edge lengths that are similar to one another.

10. A method according to any one of aspects 6 to 9 or any other aspect herein where the edge-length energy function comprises a topologically consecutive term which expresses a preference for at least some topologically consecutive edges to have target edge lengths that are similar to one another.

11. A method according to any one of aspects 6 to 10 or any other aspect herein where the edge-length energy function has the form of equation (22) described herein.

12. A method according to any one of aspects 1 to 11 or any other aspect herein wherein performing the optimization of the energy function is subject to non-inversion constraints which require at least one of: the hexahedra in the current hex-mesh to be non-inverted and the tetrahedra corresponding to each directed edge to be non-inverted.

13. A method according to aspect 12 or any other aspect herein wherein the non-inversion constraints have the form of equation (3) described herein.

14. A method according to any one of aspects 1 to 11 or any other aspect herein wherein performing the optimization of the energy function comprises performing an iterative optimization and wherein, for each iteration of the iterative optimization, the energy function comprises, for each directed edge, a weighted penalty term which expresses a preference for the directed edge to be aligned with a target edge direction $\hat{n}_{ij}$.

15. A method according to aspect 14 or any other aspect herein wherein, for each iteration of the iterative optimization, updating the weighted penalty term for each directed edge.

16. A method according to any one of aspect 14 to 15 or any other aspect herein wherein performing the first iterative procedure comprises, for each iteration of the first iterative procedure and for each directed edge, determining the target edge direction $\hat{n}_{ij}$.

17. A method according to aspect 16 or any other aspect herein wherein, for each directed edge, determining the target edge direction $\hat{n}_{ij}$ is based on characteristics of the current hex-mesh local to the edge-cone corresponding to the directed edge.

18. A method according to aspect 17 or any other aspect herein wherein, for each directed edge, determining the target edge direction $\hat{n}_{ij}$ is based only on characteristics of the current hex-mesh local to the edge-cone corresponding to the directed edge.

19. A method according to any one of aspects 17 to 18 or any other aspect herein wherein, for each directed edge, the characteristics of the current hex-mesh local to the edge-cone corresponding to the directed edge are the normal vectors of the base triangles of the edge-cone corresponding to the directed edge and the positions of the vertices which define the directed edge.

20. A method according to any one of aspects 16 to 19 or any other aspect herein wherein, for each directed edge, determining the target edge direction $\hat{n}_{ij}$ comprises performing a local optimization which optimizes (e g minimizes) a local energy function comprising a plurality of local terms, each local term expressing a preference for the target edge direction $\hat{n}_{ij}$ to be aligned with a normal vector of a corresponding one of the base triangles of the edge-cone corresponding to the directed edge.

21. A method according to aspect 20 or any other aspect herein wherein, for each directed edge, performing the local optimization comprises determining the target edge direction $\hat{n}_{ij}$ in accordance with equation having the form of (9) described above.

22. A method according to any one of aspects 20 to 21 or any other aspect herein wherein, for each directed edge, the local optimization is subject to non-inversion constraints.

23. A method according to aspect 22 or any other aspect herein wherein, for each directed edge, the non-inversion constraints have the form of at least one of: equation (3) described herein; equations (10) and (11) described herein; or equations (26) and (11) described herein.

24. A method according to any one of aspects 16 to 19 or any other aspect herein wherein, for each directed edge, determining the target edge direction $\hat{n}_{ij}$ comprises:
    initially setting an initial target edge direction $\hat{n}_{ij}$ to correspond to the direction of an average of the normal vectors of the base triangles of the edge-cone corresponding to the directed edge;
    evaluating whether the initial target edge direction $\hat{n}_{ij}$ satisfies non-inversion constraints; and
    if the initial target edge direction $\hat{n}_{ij}$ satisfies non-inversion constraints, then determining the target edge direction $\hat{n}_{ij}$ to be the initial target edge direction $\hat{n}_{ij}$ and, otherwise, performing a local optimization which minimizes a local energy function which comprising a plurality of local terms, each local term expressing a preference for the target edge direction $\hat{n}_{ij}$ to be aligned with a normal vector of a corresponding one of the base triangles of the edge-cone corresponding to the directed edge.

25. A method according to aspect 24 or any other aspect herein wherein, for each directed edge, performing the local optimization comprises determining the target edge direction $\hat{n}_{ij}$ in accordance with equation (9) described above.

26. A method according to any one of aspects 24 to 25 or any other aspect herein wherein, for each directed edge, the local optimization is subject to the non-inversion constraints.

27. A method according to any one of aspects 24 to 26 or any other aspect herein wherein, for each directed edge, the non-inversion constraints have the form of at least one of: equation (3) described herein; equations (10) and (11) described herein; or equations (26) and (11) described herein.

28. A method according to any one of aspects 16 to 27 or any other aspect herein wherein, for each iteration of the iterative optimization, the weighted penalty term is based on the target edge direction $\hat{n}_{ij}$.

29. A method according to aspect 28 or any other aspect herein wherein, for each directed edge, the weighted penalty term comprises a penalty function $E_{ij}^P$ which is optimized as part of the energy function and a penalty weight $w_{ij}^P$ that is updated between iterations of the second iterative optimization.

30. A method according to aspect 29 or any other aspect herein wherein, for each directed edge, the penalty function $E_{ij}^P$ expresses the preference for the directed edge to be aligned with a target edge direction $\hat{n}_{ij}$.

31. A method according to any one of aspects 29 to 30 or any other aspect herein wherein, for each directed edge, the penalty function $E_{ij}^P$ is a quadratic function of the target edge direction $\hat{n}_{ij}$.

32. A method according to any one of aspects 29 to 31 or any other aspect herein wherein, for each directed edge, the penalty function $E_{ij}^P$ has the form of equation (14) described above.

33. A method according to any one of aspects 29 to 32 or any other aspect herein wherein, for each directed edge, the penalty weight $w_{ij}^P$ does not decrease between iterations of the iterative optimization.

34. A method according to any one of aspects 29 to 33 or any other aspect herein wherein, for each directed edge, the penalty weight $w_{ij}^P$ is relatively low when the directed edge is relatively more aligned with a target edge direction $\hat{n}_{ij}$ and relatively high when the directed edge is relatively less aligned with the edge direction $\hat{n}_{ij}$.

35. A method according to any one of aspects 29 to 34 or any other aspect herein wherein the penalty weight $w_{ij}^P$ has the form of equation (16) described above.

36. A method according to any one of aspects 28 to 35 or any other aspect herein wherein, for each directed edge, the weighted penalty term comprises a geometry factor $W(\alpha_{ij})$ based at least in part on a largest angle $\alpha_{ij}$ between the target direction $\hat{n}_{ij}$ and the normal vectors of base triangles of the edge-cone corresponding to the directed edge.

37. A method according to aspect 36 or any other aspect herein wherein the geometry factor $W(a_u)$ increases as the largest angle $a_u$ grows.

38. A method according to any one of aspects 36 to 37 or any other aspect herein wherein the geometry factor $W(a_u)$ has the form of either: equation (17) described above; or equation (27) described above.

39. A method according to any one of aspects 14 to 38 or any other aspect herein wherein, for each iteration of the iterative optimization, the energy function comprises a parallel-edges regularization term $E_{regularize\_parallel}$, which expresses a preference for directions of topologically parallel edges of the same hexahedron to be the same.

40. A method according to aspect 39 or any other aspect herein wherein the parallel-edges regularization term $E_{regularize\_parallel}$, has the form of the left-most expression on the right-hand side of equation (19) described herein.

41. A method according to any one of aspects 14 to 40 or any other aspect herein wherein, for each iteration of the iterative optimization, the energy function comprises a consecutive-edges regularization term $E_{regularize\_consecutive}$, which expresses a preference for directions of topologically consecutive edges of face-adjacent hexahedra to be the same.

42. A method according to aspect 41 or any other aspect herein wherein the consecutive-edges regularization term $E_{regularize\_consecutive}$ has the form of the right-most expression on the right-hand side of equation (19) described herein.

43. A method according to any one of aspects 20 to 27 or any other aspect herein wherein, for each surface directed edge having both of its vertices on a surface boundary of the input mesh, performing the local optimization comprises optimizing (e.g. minimizing) a boundary-edge energy function which expresses a preference for the surface directed edge to remain on the surface boundary.

44. A method according to aspect 43 or any other aspect herein wherein optimizing the boundary-edge energy function comprises solving an equation having the form of equation (20) described herein.

45. A method according to any one of aspects 1 to 44 or any other aspect herein wherein the energy function comprises a boundary preservation term $E_{boundary}$ which expresses a preference for vertices which are on a surface boundary of the input hex mesh to remain on the boundary surface.

46. A method according to any one of aspects 14 to 44 or any other aspect herein wherein, for each iteration of the iterative optimization, the energy function comprises a boundary preservation term $E_{boundary}$ which expresses a preference for vertices which are on a surface boundary of the input hex mesh to remain on the boundary surface.

47. A method according to any one of aspects 45 to 46 or any other aspect herein wherein the boundary preservation term $E_{boundary}$ depends, for each surface vertex, whether the surface vertex is a feature vertex of an object underlying the input mesh, a corner vertex of the object underlying the input mesh or a regular surface vertex of the object underlying the input mesh.

48. A method according to aspect 47 or any other aspect herein wherein the boundary preservation term $E_{boundary}$ has a form of equation (21) described above.

49. A method according to any one of aspects 45 to 47 or any other aspect herein wherein the boundary preservation term $E_{boundary}$ has a form of at least one of the terms on the right hand side of equation (21) described above.

50. A method according to any one of aspects 20 to 27 or any other aspect herein wherein, for each directed edge, performing the location optimization comprises performing the local optimization with first non-inversion constraints until the current mesh is free from inverted hexahedra and then switching the first non-inversion constraints to first quality-improvement constraints which require improved quality relative to previous iterations of the local optimization.

51. A method according to aspect 50 or any other aspect herein wherein the first non-inversion constraints have the form of equation (9) described above and the first quality improvement constraints have the form of equation 26) described above.

52. A method according to any one of aspect 36 to 38 or any other aspect herein comprising, for each iteration of the first iterative process, determining a worst angle w from among the largest angles $\alpha_{ij}$ across the plurality of edge-cones corresponding to the plurality of directed edges in the current mesh, and if w is less than 90°, changing the geometry factor $W(\alpha_{ij})$ from a first geometry factor to a second geometry factor for subsequent iterations of the first iterative process, the second geometry factor different from the first geometry factor.

53. A method according to aspect 52 or any other aspect herein wherein the first geometry factor has the form of equation (17) described above.

54. A method according to any one of aspects 52 to 53 or any other aspect herein wherein the second geometry factor has the form of equation (27) described above.

55. A system for improving quality of a hex-mesh, the system comprising:
one or more processors configured to:
obtain an input hex-mesh;
perform a first iterative procedure which starts with the input hex-mesh and which outputs an output hex-mesh having improved quality relative to the input hex-mesh;
wherein the one or more processors are configured to perform the first iterative procedure by:
initializing a current hex-mesh to be equal to the input hex mesh;
for each iteration of the first iterative procedure:
performing an optimization (e g minimization) of an energy function over a plurality of directed-edges in the current hex-mesh to determine updated vertex positions for vertices in the current hex-mesh, wherein for each directed edge, the energy function comprises a term that expresses a preference for the directed edge to be aligned with normal vectors of base triangles of an edge-cone corresponding to the directed edge; and
updating the current hex-mesh with the updated vertex positions; and
after one or more iterations, setting the output hex-mesh to be equal to the current hex-mesh.

56. A system according to aspect 55 which comprises any feature, combination or features or sub-combination of features analogous to any of aspects 1 to 54.

57. A non-transitory computer-readable medium comprising computer executable code that, when executed by a computer system comprising one computer or a plurality of computers operatively connected using a data communications network, causes the computer system to perform the method of aspect 1.

58. A non-transitory computer-readable medium according to aspect 57 or any other aspect herein that, when executed by a computer system comprising one computer or a plurality of computers operatively connected using a data communications network, causes the computer system to perform any feature, combination or features or sub-combination of features analogous to any of aspects 1 to 54.

In addition to the exemplary aspects and embodiments described above, further aspects and embodiments will become apparent by reference to the drawings and by study of the following detailed descriptions.

Description

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

One aspect of the invention provides a computer-based automated method for improving the quality of (optimizing) an input hexahedral mesh (hex-mesh). The output of the method may be an output hex-mesh having improved average hexahedral element quality and/or improved minimum hexahedral element quality. As used herein, the relative quality of a hex-mesh element (i.e. a hexahedral element) may refer to how close the shape of the hex-mesh element is to a perfect cubic shape. Where a first hex-mesh element has a shape that is relatively close to a cubic shape (as compared to the shape of a second hex-mesh element), the first hex-mesh element may be referred to as having a higher quality (a better quality, an improved quality and/or the like) relative to the second hex-mesh element. Concave or inverted hex-mesh elements may be understood to have low quality relative to convex hex-mesh elements. For brevity, as used herein, the term mesh should be understood to refer to a hex-mesh, unless the context dictates otherwise.

FIG. 1 schematically illustrates an automated (computer-implemented) method 100 for optimizing (i.e. improving the quality of) an input hex-mesh 102 to generate an output hex-mesh 158 having an improved quality relative to input mesh 102, according to a particular embodiment. Method 100 (and its individual functional blocks) may be performed by a suitably configured computer or computer system (referred to herein as a computer). Such a computer may comprise hardware, software, firmware or any combination thereof, and may be implemented using any of a wide variety of components. By way of non-limiting example, such a computer may comprise a programmed computer system comprising one or more processors, user input apparatus, displays and/or the like. Such a computer may be implemented as an embedded system and may share components (e.g. a processor) with other apparatus/devices. Such a computer may comprise one or more microprocessors, digital signal processors, graphics processors, field programmable gate arrays, signal conditioning circuitry and/or hardware (e.g. amplifier circuits and/or the like) and/or the like. Components of the computer may be combined or subdivided, and components of the computer may comprise sub-components shared with other components of the computer.

Method 100 commences in block 110 which comprises obtaining an input hex-mesh 102. In general, input hex-mesh 102 can be obtained in block 110 using any suitable technique. In some embodiments, block 110 comprises receiving input hex-mesh 102 from an external system (e.g. via a suitable hardware and/or software input interface, such as a USB interface, a network interface and/or the like). In some embodiments, block 110 comprises obtaining input hex-mesh 102 from local memory and/or from a different software application running on the same computer. In some embodiments, input hex-mesh 102 obtained in block 110 comprises an automatically generated hex-mesh (e.g. a hex-mesh generated by an automated (computer-based) hex-mesh generation technique). Non-limiting examples of suitable automated hex-mesh generation techniques are disclosed, for example, in: SHEPHERD, J. F., AND JOHNSON, C. R. 2008. Hexahedral mesh generation constraints. *Engineering with Computers* 24, 3, 195-213; SCHNEIDERS, R. 1996. A grid-based algorithm for the generation of hexahedral element meshes. *Engineering with Computers* 12, 168-177; MARECHAL, L. 2009. Advances in octree-based all-hexahedral mesh generation: handling sharp features. *In Proc. International Meshing Roundtable;* TAUTGES, T. J., BLACKER, T., AND MITCHELL, S. A. 1996. The whisker weaving algorithm: a connectivity-based method for constructing all-hexahedral finite element meshes. *Intl. Journal for Numerical Methods in Engineering* 39, 19, 3327-3349; MIYOSHI, K., AND BLACKER, T. 2000. Hexahedral mesh generation using multi-axis cooper algorithm. *In Proc. International Meshing Roundtable,* 89-97; LI, Y., LIU, Y., XU, W., WANG, W., AND GUO, B. 2012. All-hex meshing using singularity-restricted field. *ACM Trans. Graph.* 31, 6; GREGSON, J., SHEFFER, A., AND ZHANG, E. 2011. All-hex mesh generation via volumetric polycube deformation. *Computer Graphics Forum (Proc. SGP* 2011); LIVESU, M., VINING, N., SHEFFER, A., GREGSON, J., AND SCATENI, R. 2013. Polycut: monotone graph-cuts for polycube base-complex construction. *ACM Trans. Graph.* 32,6; and HUANG, J., JIANG, T., SHI, Z., TONG, Y., BAO, H., AND DESBRUN, M. 2014. $L_1$ based construction of polycube maps from complex shapes. *ACM Trans. Graph.* 33, 3 (June), 25:1-25:11.

In the illustrated embodiment of FIG. 1, block 110 also comprises initializing a current hex-mesh 112 to be the input hex-mesh 102. Subsequent operations in method 100 are then performed on current mesh 112 which may be updated during the course of method 100.

Once input hex mesh 102 is obtained in block 110, method 100 proceeds to optional block 120 which involves determining target edge lengths for the hex elements of current hex-mesh 112. Optional block 120 is not necessary. In some embodiments, block 120 is not present. Optional block 120 is described in more detail below. Method 100 then proceeds to block 150 which comprises a mesh optimization procedure based on an edge-cone formulation described in more detail below. The block 150 mesh optimization comprises improving the quality of input mesh 102 (or the initialized version of current hex-mesh 112) to generate output mesh 158, wherein the quality of output mesh 158 is improved relative to that of input mesh 102.

In block 150, method 100 comprises performing an optimization procedure which involves determining new vertex positions for each directed edge in current hex-mesh 112 and outputting output hex-mesh 158 based on these new vertex positions. The block 150 procedure may depend on a mesh quality assessment based on evaluation of so-called edge cones. The concept of edge-cones and their relationship to hex-mesh quality is now described.

Figure 2A:
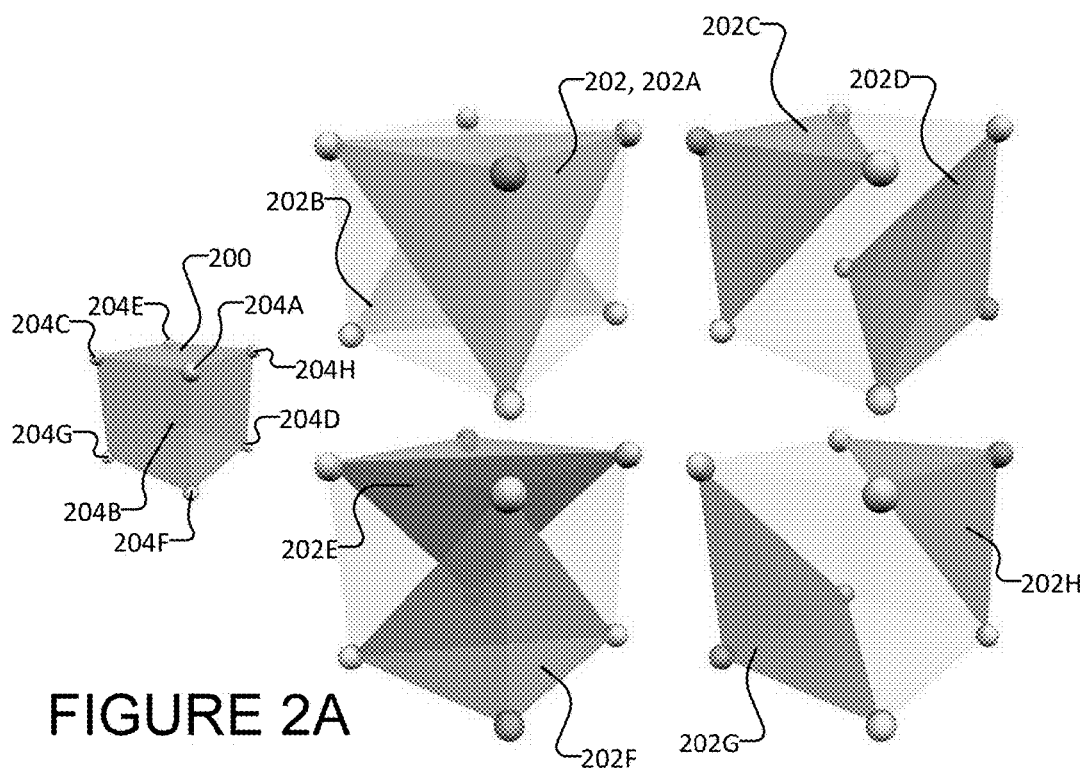
FIG. 2A shows an exemplary hex-segment of a hex-mesh and its corresponding corner tetrahedrals.

FIG. 2A shows an ideal (i.e. cubic) hexahedral element 200 and the eight tetrahedrals 202A-202H (collectively, tetrahedrals 202) defined by the outgoing edges of the eight corner vertices 204A-204H (collectively, corners 204) of hex-element 200. In ideal hex-element 200, for each corner 204, each directed edge (not specifically enumerated) extending from the corner 204 is parallel to the normal vector (or, for brevity, the normal) of the planar face that is bounded by the other edges emanating from the corner 204. A hex-element is inverted if the angle between even one directed edge and its corresponding face normal (i.e. the normal of the planar face that is bounded by the other edges emanating from the same corner) is over 90°. It can be observed from FIG. 2A that the tetrahedrals 202 are formed by pairs of directed edges and corresponding triangular faces, with each such pair comprising: one directed edge that emanates from a corner; and one corresponding triangular face (i.e. the planar triangular face which is bounded by the other edges emanating from the same corner).

Figure 2B:
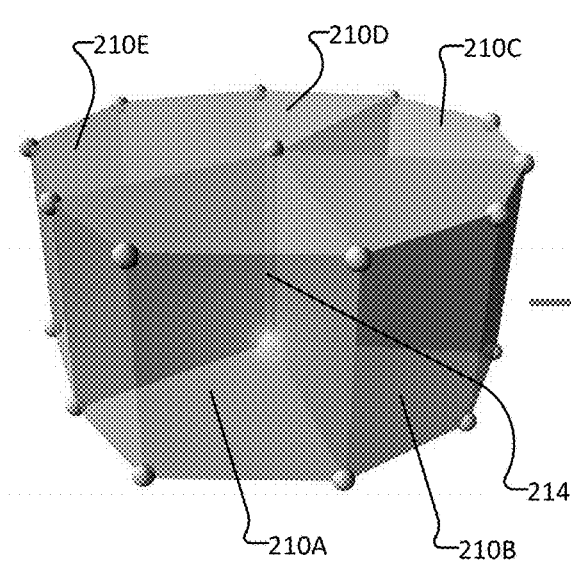
FIG. 2B shows an exemplary directed edge in a hex-mesh and the hexahedrons surrounding the directed edge.
Figure 2C:
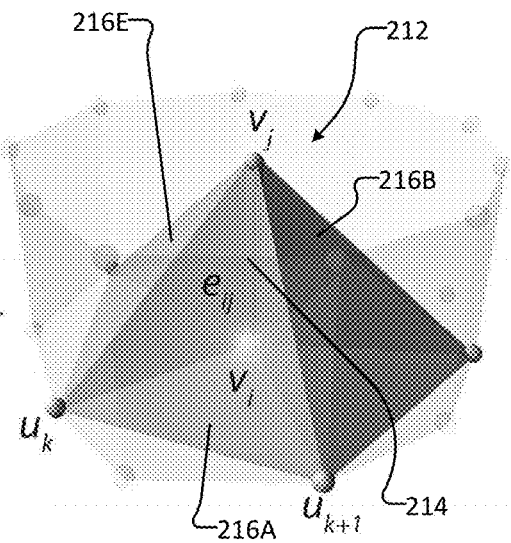
FIG. 2C shows an exemplary directed edge in a hex-mesh, its corresponding edge-cone, the hexahedra and corresponding base triangles of its corresponding edge-cone and the normal vectors of its base triangles.

FIGS. 2B and 2C schematically depict the formation of an edge-cone 212 which may be used to evaluate mesh quality in accordance with particular embodiments. Each edge-cone 212 corresponds to (or has a one-to-one relationship) with a directed edge 214. As shown best in FIG. 2C, directed edge 214 may extend from vertex $v_i$ to vertex $v_j$ and may be referred to as directed edge $(v_i,v_j)$. As shown in FIG. 2B, directed edge 214 is a part of (i.e. an edge of) a number of hexahedrons 210A-210E (collectively, hexahedrons 210). As shown in FIG. 2C, for each such hexahedron 210, directed edge 214 may be part of (i.e. an edge of) a corresponding tetrahedron 216A-216E (collectively, tetrahedrons 216) formed by directed edge 214 and a corresponding face (i.e. the planar face which is bounded by the other edges of the same hexahedron 210 which emanate from the same vertex $v_i$. It should be noted that only tetrahedrons 216A, 216B, 216E are visible in FIG. 2C. The union of tetrahedrons 216 corresponding to directed edge 214, $(v_i, v_j)$ may be referred to as the edge-cone 212 corresponding to directed edge 214, $(v_i, v_j)$.

In some embodiments, the quality of a hex-mesh that includes a plurality of directed edges may be expressed in terms of the differences between the directions of: the directed edges which form the axes of corresponding edge-cones and the normal vectors of the triangular faces at their bases. For the particular edge-cone 212 shown in FIG. 2C, the quality of the edge cone may be expressed in terms of the differences between the direction of directed edge directed edge 214, $(v_i, v_j)$ and the normal vectors of the triangles at the bases of tetrahedrons 216. By way of example, for tetrahedron 216A shown in FIG. 2C, the angular difference which goes into the quality evaluation may be the angular difference between the direction of directed edge 214, $(v_i, v_j)$ and the normal vector corresponding to the triangle formed by vertices $v_i$, $u_k$ and $u_{k+1}$. FIG. 12D illustrates an exemplary directed edge 218 and the normal vectors 220A-220D (collectively, normal vectors 220) for the triangles 222A-222D (collectively, triangles 222) at the bases of corresponding tetrahedrons (not shown in FIG. 2D). If these angles are less than 90° for all the triangular faces, for all of the edge cones in a hex-mesh, then the hex-mesh is inversion free.

Referring back to FIG. 1, the block 150 optimization procedure may comprise determining new vertices for each directed edge in current mesh 112. Instead of directly assessing the quality of each hex-element in current mesh 112 and instead of assessing the quality of each hex-element of current mesh 112 using the eight tetrahedra associated with the eight corners of the hex-element, the block 150 optimization procedure may involve evaluating the quality of current mesh 112 by traversing the edge-cones in current mesh 112 and evaluating the quality of each edge-cone.

Figure 2D:
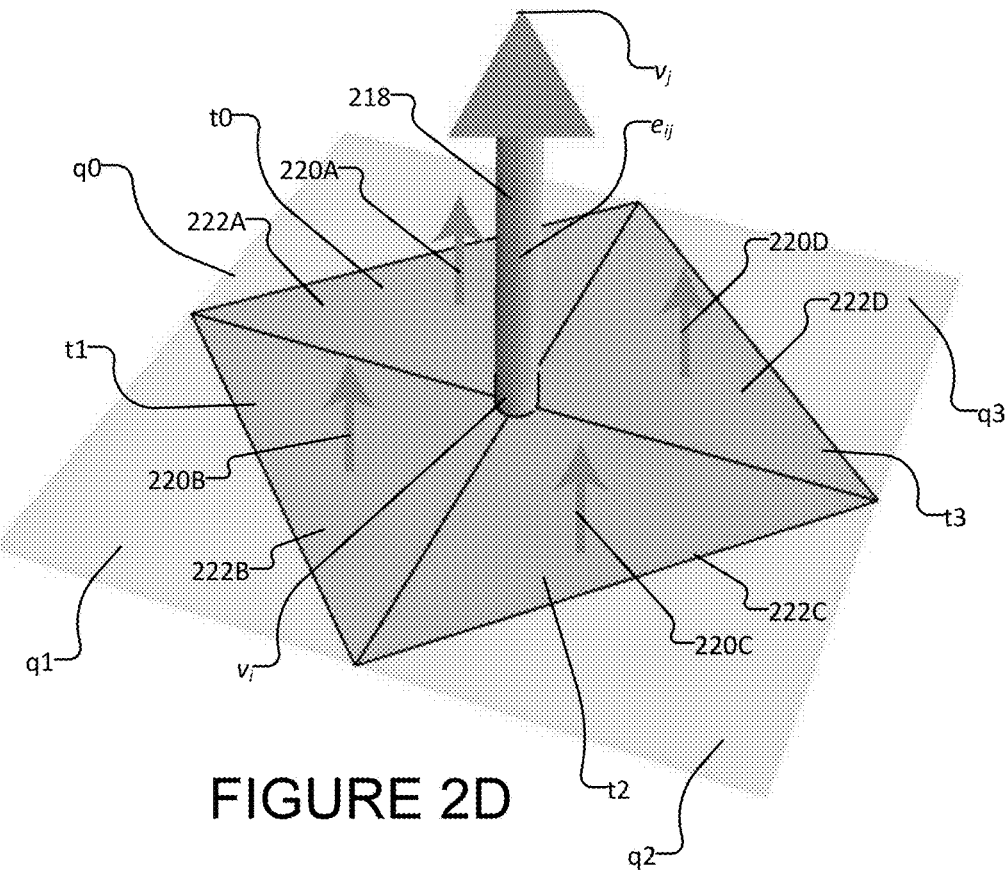
FIG. 2D schematically depicts a directed edge $e_{ij}$, the base triangles $t_0$, $t_1$, $t_2$, $t_3$ of its edge-cone and the normal vectors of the base triangles.

A particular embodiment of block 150 is now described. For the purposes of this explanation, we define $\mathcal{H}$ to be a general hex-mesh with vertices $\mathcal{V}\mathcal{H}$ and edges $\mathcal{H}\mathcal{E}$) respectively. For each directed edge $(v_i, v_j)$, we define $e_{ij}$ to correspond to the vector $v_i$-$v_j$. While the variables expressed in the description that follows may be expressed in terms of eij, in some embodiments, the variables actually optimized may comprise the underlying vertex positions. If we consider a directed edge $e_{ij}$ from among the edges $\mathcal{H}\mathcal{H}$ and the collection of all hexahedra H that contain $e_{ij}$, then we may define a set $Q=\{q_k\}$ to be the set (e.g. the umbrella) of quadrilaterals belonging to H and containing the vertex $v_i$ but not the vertex $v_j$ we may further define $T=\{t_k\}$ to be the set (e.g. the fan) of triangles that are connected to the vertex $v_i$, with the understanding that T has a winding order consistent with the winding order of the quads of Q and that $t_{|T|}=t_0$ (i.e. the indices of $t_k$ reach a finite number and then return to zero). FIG. 2D schematically illustrates examples of such quadrilaterals $Q=\{q_0 \ldots q_3\}$ and triangles $T=\{t_0 \ldots t_3\}$ for the particular example directed edge 218 shown in FIG. 2D.

Typically, an input hexahedral mesh may be assumed to have (or may be assigned) a consistent ordering of vertices, such that the vertices of any quadrilateral forming an individual hexahedral element, when viewed from the center of the hexahedral element, has a counterclockwise orientation. This in turn infers a counterclockwise orientation on the tetrahedral decomposition of the hexahedral elements of the mesh, and therefore on the vertices of any triangle on the tetrahedron. Denoting the vertices of an arbitrary triangle $t_k$ as $u_k$; $v_i$; $u_{k+1}$ (as shown for a particular example triangle in FIG. 2C), it follows that for the tetrahedron having vertices $v_i$; $v_j$; $u_k$; $u_{k+1}$ to have a positive volume, the vertex $v_j$ must lie on the positive side of the supporting plane of the triangle $t_k$ (i.e. the triangle having vertices $u_k$; $v_i$; $u_{k+1}$). This positive tetrahedral volume and corresponding condition on the vertices may be imposed for each triangle in the set T. The shape of each tetrahedron (e.g. its scaled Jacobian) is optimized if directed edge $e_{ij}$ is aligned with the normal vectors $n_k$ corresponding to the triangles $t_k$ in the set T and, when the shape of a tetrahedron is optimized, the shape of the corresponding portion of its hexahedron is also optimized.

The block 150 optimization procedure may comprise determining the directions of each normalized directed edge $\hat{e}_{ij}$(e.g.

$$\frac{e_{ij}}{\|e_{ij}\|})$$

and/or corresponding positions of vertices $v_i$ for current mesh 112, which minimize an energy function $E_{global}$ comprising an energy term $E_{cone}$, where $E_{cone}$ depends on the difference in orientation between the direction of edge $e_{ij}$ and the normal vectors $n_k$ of its corresponding triangles over each directed edge in the current mesh 112. In one particular example embodiment, the energy function $E_{global}$ includes only the energy term $E_{cone}$—i.e.:

$$E_{global}=E_{cone} \tag{1a}$$

In another example embodiment, the energy function $E_{global}$ is given by:

$$E_{global}=E_{cone}+E_{boundary} \tag{1b}$$

where $E_{boundary}$ represents a term that aims to preserve the boundary of input hex-mesh 102 and which is explained in more detail below.

In one particular example embodiment, the energy term $E_{cone}$ may be given by:

$$E_{cone} = \sum_{e_{ij}\in E} \sum_{t_k \in T(e_{ij})} \left(\frac{e_{ij}}{\|e_{ij}\|} - n_k\right)^2 \tag{2}$$

where the left summation operator is over all of the directed edges $e_{ij}$ in current hex-mesh 112 and the right summation operator is over all of the base triangles $t_k$ in an edge-cone corresponding to a particular directed edge $e_{ij}$.

The block 150 optimization and the corresponding minimization of the energy function $E_{global}$ (of equation (1a) or (1b)) may be subject to non-inversion constraints which prevent the solutions of the block 150 optimization (i.e. the vertex positions $v_i$) from corresponding to inverted hex-elements and/or inverted tetrahedra. In one particular embodiment, these block 150 non-inversion constraints may have the form, for each directed edge $e_{ij}$:

$$e_{ij} \cdot n_k > 0 \; \forall e_{ij} \in \varepsilon, \; t_k \in T(e_{ij}) \tag{3}$$

where the normal $n_k$ may be explicitly defined as a function of vertex positions:

$$n_k - \frac{(u_k - v_i) \times (u_{k+1} - v_i)}{\|(u_k - v_i) \times (u_{k+1} - v_i)\|} = 0 \forall\ e_{ij} \in \varepsilon, t_k \in T(e_{ij}) \quad (4)$$

It may be observed that the energy term $E_{cone}$ of equation (2) expressly accounts for the opposite directions of each directed edge $e_{ij}$ separately, as the tightness of the constraints on these directions may significantly differ.

Given the typical size of real-world meshes, optimizing the formulation of equations (1)-(4) directly using standard non-linear optimization methods may be impractical. In particular, the normalization by edge length in this formulation may present optimization challenges. Consequently, in some embodiments, the block 150 optimization involves the use of pre-estimated edge lengths $L_{ij}$, where $L_{ij}$ represents the pre-estimated length of the edge between the vertices $v_i$ and $v_j$. Pre-estimated edge lengths $L_{ij}$ may be determined in block 120, which is discussed in more detail below. Substituting such pre-estimated edge lengths $L_{ij}$ into equation (2) reduces equation (2) to the quadratic function:

$$E_{cone} = E_{Qcone} = \sum_{e_{ij} \in E} \sum_{t_k \in T(e_{ij})} \left( \frac{e_{ij}}{L_{ij}} - n_k \right)^2 \quad (5)$$

and reduces equation (4) to:

$$n_k - \frac{(u_k - v_i) \times (u_{k+1} - v_i)}{\|L_{k,i} \times L_{k+1,i}\|} = 0 \forall\ e_{ij} \in \varepsilon, t_k \in T(e_{ij}) \quad (6)$$

Figure 3:
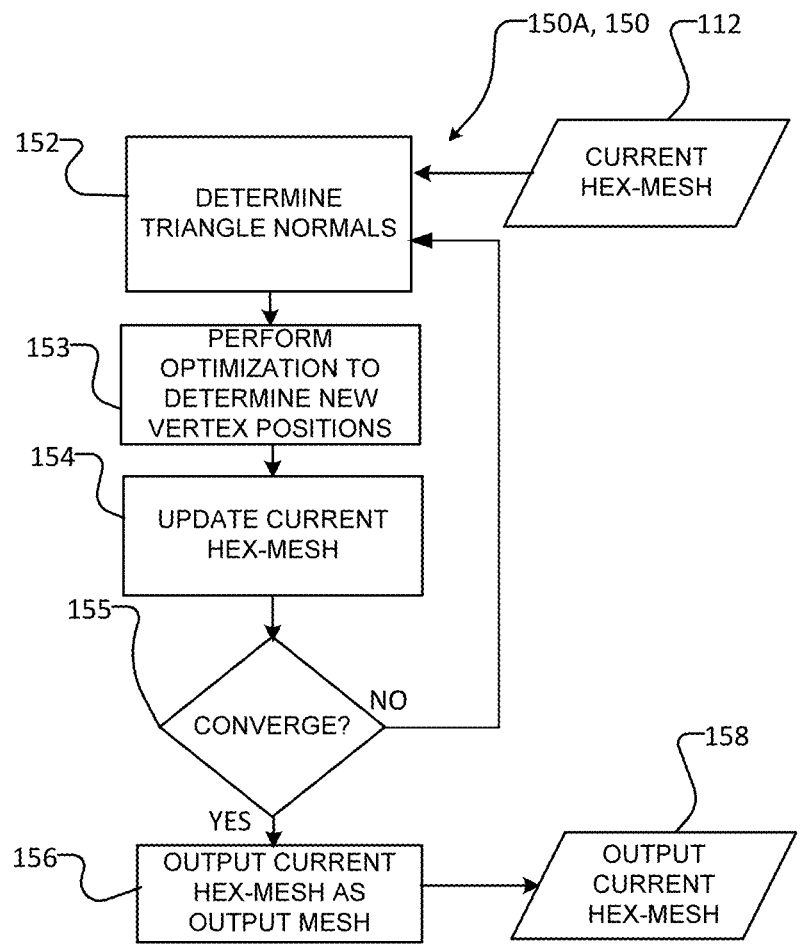
FIG. 3 is a schematic illustration of an automated (computer-implemented) method which may be used to implement the FIG. 1 optimization procedure according to an example embodiment.

FIG. 3 is a schematic illustration of a method 150A which may be used to implement the block 150 optimization procedure according to an example embodiment. Method 150A comprises (i) determining triangle normals $n_k$ (in block 152) for each triangle in the edge-cone corresponding to each directed edge $e_{ij}$. The block 152 triangle normal determination may be performed using current hex-mesh 112 and may comprise using equations having a form of either equation (4) or equation (6);

(ii) determining new vertex positions $v_1$ (in block 153) by minimizing an energy function $E_{global}$ having a form of either equation (1a) or equation (1b) subject to the constraints of equation (3). The block 153 optimization may be performed on the basis of current hex-mesh 112. Where the approximate normals $n_k$ of equation (6) are used for step (i) (block 152), then step (ii) (block 153) may comprise a quadratic minimization problem with linear inequalities, solvable with standard quadratic programming methods. The step (ii) (block 153) quadratic minimization problem is convex and has a unique minimum;

(iii) updating current hex-mesh 112 (in block 154) to have the new vertex positions $v_i$ determined in step (ii) (block 153); and (iv) repeating steps (i), (ii) and (iii) (blocks 152, 153 and 154) until satisfying a convergence criteria in block 155. Assessing convergence in block 155 may involve evaluating one or more convergence criteria. By way of non-limiting example, such block 155 convergence criteria may comprise: iteration-to-iteration changes in vertex positions that are below a convergence threshold; iteration-to-iteration changes in the energy function value that are below a convergence threshold; temporal thresholds; thresholds based on a number of iterations; until the quality of the hex mesh is above a minimum threshold for all hexahedral elements in the hex mesh; until the average quality of the hexahedral elements of the hex mesh is above a certain threshold; some combination of the above; and/or the like.

(v) outputting the updated current hex-mesh 112 as output hex mesh 158 once the block 155 convergence criteria are satisfied.

With the FIG. 3 embodiment (method 150A) of the block 150 optimization procedure, the resultant output hex-mesh 158 at the conclusion of method 150A has no inverted hex-elements. In some embodiments, when convergence occurs (block 155 YES branch) and the method 150A procedure terminates by outputting the vertex positions $v_i$ of current hex-mesh 112 as output hex-mesh 158 (block 156), the vertex positions $v_i$, and hence the corresponding triangle normal $n_k$, no longer change and, accordingly, the non-inversion constraints (equation (3) hold for the normals $n_k$ of output hex-mesh 158. In some circumstances, method 150A may terminate prematurely without finding a set of vertex positions $v_i$ that satisfies all of the non-equation (3) inversion constraints at the same time. Such a situation can arise in a number of scenarios including, without limitation, the case of degenerate base triangles, whose normals computed using equation (6) have zero length. Such scenarios can and do occur in practice if input mesh 102 is badly tangled (e.g. has a relatively large number of inverted hex-elements). However, since triangle normals can and do change as mesh vertices move, the fact that a current set of normals does not allow for a solution does not necessarily imply that a solution does not exist for a given mesh topology.

Figure 4:
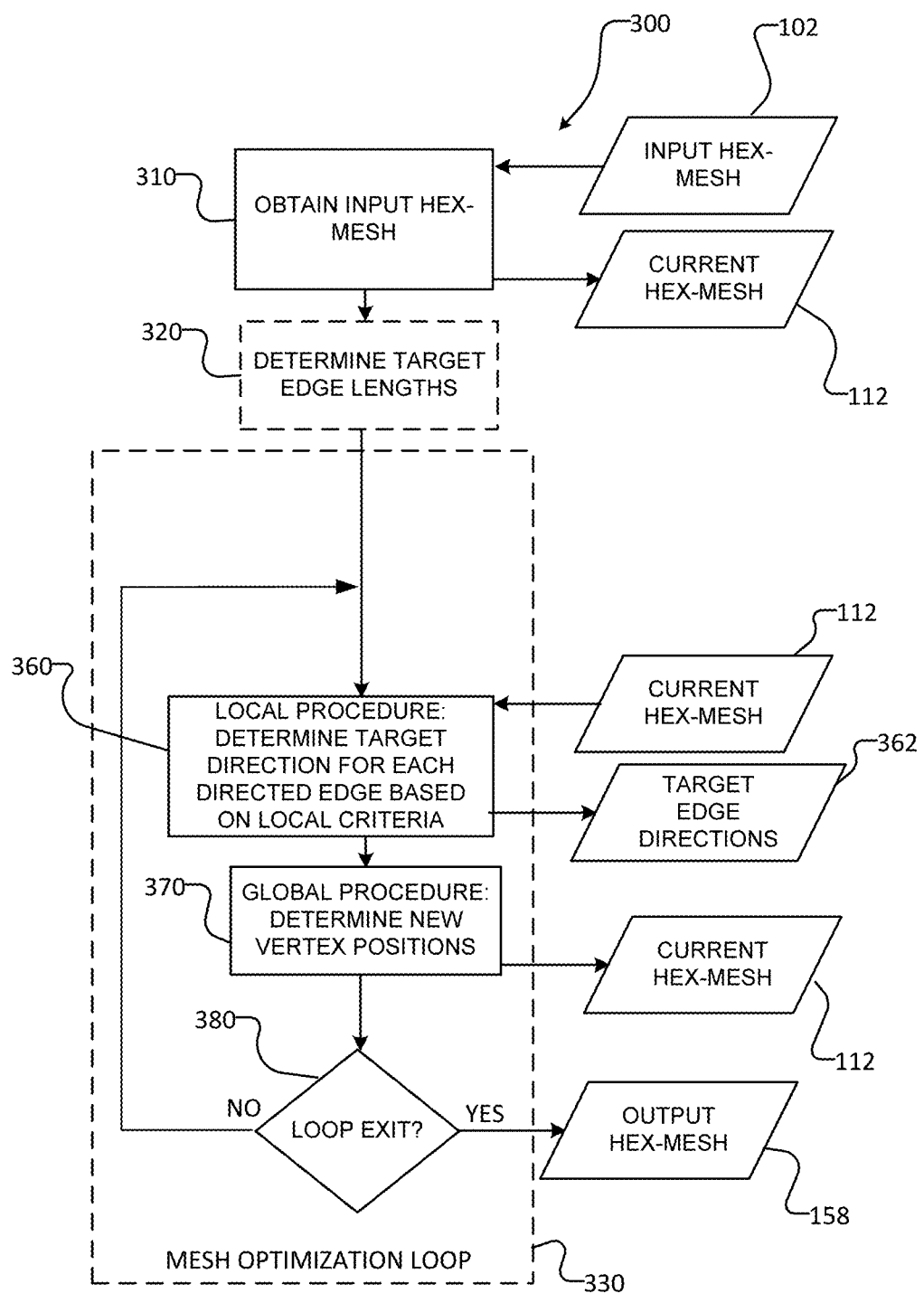
FIG. 4 schematically illustrates an automated (computer-implemented) method for optimizing (i.e. improving the quality of) an input hex-mesh to generate an improved quality output hex-mesh according to a particular embodiment.

FIG. 4 schematically illustrates an automated (computer-implemented) method 300 for optimizing (i.e. improving the quality of) an input hex-mesh 102 to generate an improved quality output hex-mesh 158 according to a particular embodiment. Method 300 (and its individual functional blocks) may be performed by a suitably configured computer which may have any of the above-described characteristics of the computer that performs method 100. Method 300 commences in block 310 which comprises obtaining an input hex-mesh 102. In general, block 310 of method 300 may be substantially similar to block 110 of method 100 discussed above. Like block 110 described above, block 310 may comprise initializing a current hex-mesh 112 to be the input hex-mesh 102. Subsequent operations in method 300 are then performed on current mesh 112 which may be updated during the course of method 300.

Once input hex mesh 102 is obtained and current hex-mesh 112 is initialized in block 110, method 300 proceeds to optional block 320 which involves determining target edge lengths for the hex elements of current hex-mesh 112. Optional block 320 may be substantially similar to block 120 described elsewhere herein. In some embodiments, block 320 is not present. Method 300 then proceeds to block 330 which comprises a combined local/global mesh optimization loop (or for brevity, a mesh optimization loop 330). Mesh optimization loop 330 comprises improving the quality of input hex-mesh 102 to generate output hex-mesh 158, wherein the quality of output hex-mesh 158 is improved relative to that of input hex-mesh 102. In the illustrated FIG. 4 embodiment, mesh optimization loop 330 starts in block 360.

In block 360 of the illustrated FIG. 4 embodiment, method 300 comprises performing a local procedure (e.g. local to each directed edge $e_{ij}$ and its corresponding edge-cone). Block 360 may involve determining target directions $\hat{n}_{ij}$ for each directed edge $e_{ij}$ based only on parameters associated with the edge-cone corresponding to the directed edge $e_{ij}$ (e.g. based on the base triangle normals $n_k$ of the edge-cone corresponding to the particular directed edge $e_{ij}$). In some embodiments, block 360 may comprise performing a local constrained optimization for each directed edge $e_{ij}$, where the constraints comprise local non-inversion constraints based on the edge-cone corresponding to the particular directed edge $e_{ij}$ (e.g. non-inversion constraints based on the base triangle normals $n_k$ of the edge cone corresponding to the particular directed edge $e_{ij}$).

In one particular embodiment, block 360 comprises, for each directed edge $e_{ij}$, determining a target direction $\hat{n}_{ij}$ based on a local optimization having the form:

$$\tilde{n}_{ij} = \arg\min \Sigma_{k=0}^{T} (\tilde{n}_{ij} - n_k)^2 \qquad (9)$$

subject to the local non-inversion constraints having the form:

$$\hat{n}_{ij} \cdot n_k \leq \varepsilon < 0 \; \forall t_k \in T \qquad (10)$$

$$\|\tilde{n}_{ij}\|^2 \leq 1 \qquad (11)$$

It may be observed that equations (9)-(11) form a constrained optimization problem whose solution $\hat{n}_{ij}$ minimizes equation (9) subject to the constraints of equations (10) and (11). It may also be observed that equation (9) and (10) are only evaluated over the local edge-cone that corresponds to the directed edge $e_{ij}$ and the base triangles of the local edge-cone. The convex constraint of equation (11) replaces the explicit, but non-convex, requirement for the target direction $\hat{n}_{ij}$ to have unit length. In some embodiments, the equation (11) constraint could be replaced by an equality (e.g. $\|\hat{n}_{ij}\|^2 = 1$). In block 360, the base triangle normals $n_k$ may be determined based on current hex mesh 112. The current hex mesh 112 used in block 360 may be based on: the initialized value of current hex mesh 112 (applied in block 310); or the update to current hex mesh 112 after the last iteration of mesh optimization loop 330 (e.g. after the block 370 global procedure, as described in more detail below). The base triangle normals $n_k$ may be determined on the basis of an equation having the form of equation (4) or equation (6) and, in some embodiments, may be normalized to have unit length. The resulting target directions $\tilde{n}_{ij}$ may be similarly normalized. It should be noted that if all that was required was for the dot product $\hat{n}_{ij} \cdot n_k$ to be positive, the equation (11) constraint could be eliminated. However, in some embodiments, a greater than zero threshold $\varepsilon$ is used in the equation (10) constraint (for reasons discussed in more detail below). Accordingly, the equation (11) constraint is explicitly included in this description to prevent the resulting target directions $\hat{n}_{ij}$ from satisfying the equation (10) constraint by scaling.

The block 360 local optimization (as characterized by the formulation of equations (9), (10) and (11) or otherwise) may comprise, for each directed edge $e_{ij}$, a quadratic convex optimization problem with linear and quadratic inequality constraints on the three coordinates of target direction $\hat{n}_{ij}$. The block 360 optimization can be solved efficiently and robustly using standard quadratic programming tools such as, by way of non-limiting example, those disclosed by GUROBI OPTIMIZATION, 2013 at http://www.gurobi.com/. In some circumstances (e.g. with some directed edges of particular input meshes 102), equation (9) is minimized by a target direction $\hat{n}_{ij}$ that is the conventional average of the base triangle normal $n_k$ and satisfies the non-inversion constraints (e.g. constraints of the form of equations (10) and (11)) as-is. Consequently, in some embodiments, to speed-up computation, block 360 may first attempt to determine a base solution target direction $\hat{n}_{ij}$ (e.g. a target direction $\hat{n}_{ij}$ that is the conventional average of the base triangle normal $n_k$) and evaluate whether the base solution target direction $\hat{n}_{ij}$ satisfies the non-inversion constraints. If it is determined that the base solution target direction $\hat{n}_{ij}$ does not satisfy the non-inversion constraints, block 360 may revert to using a quadratic programming solver.

Where the block 360 local optimization is a quadratic convex optimization problem with linear and quadratic inequality constraints, a target direction $\hat{n}_{ij}$ that satisfies all the non-inversion constraints may not always exist. However, an advantage of a localized solution is that method 300 can still proceed with the block 370 global procedure (or the remaining portion of an iteration of mesh optimization loop 330) in a meaningful way, even without a block 360 solution. Where, for a particular directed edge $e_u$, the block 360 local optimization does not yield an inversion-free solution, block 360 may, in some embodiments, return the target direction $\hat{n}_{ij}$ to be either the current edge direction (e.g. the direction of $e_{ij}$ in current hex-mesh 112) or the average of the base triangle normals $n_k$ (e.g. the unconstrained minimizer of equation (9)). In some embodiments, the decision between these two output target directions $\hat{n}_{ij}$ may be based on the largest angle $\alpha_{ij}$ between the direction of the proposed output target direction $\hat{n}_{ij}$ and the base triangle normals $n_k$. In some embodiments, where this circumstance arises for a particular directed edge $e_{ij}$ in block 360, block 360 comprises selecting the output target directions $\hat{n}_{ij}$ to be the direction for which this largest angle $a_u$ is the smallest. In some embodiments, block 360 may make this same election of output target directions $\hat{n}_{ij}$ if one of the base triangle normals $n_k$ has zero length. Since, in some embodiments, the block 360 local optimization seeks for all directed edges $e_{ij}$ to have a known target length (e.g. $L_{ij}$) and indirectly optimizes the base triangle angles $\alpha_{ij}$, such degenerate configurations are typically resolved during the first iteration of mesh-optimization loop 330.

In some embodiments, the above discussed implementation of block 360 is used for interior edges $e_{ij}$ (i.e. edges $e_{ij}$ other than surface edge). In some embodiments, block 360 may use a modified formulation for surface edges. This modified formulation is described in more detail below.

Figure 5:
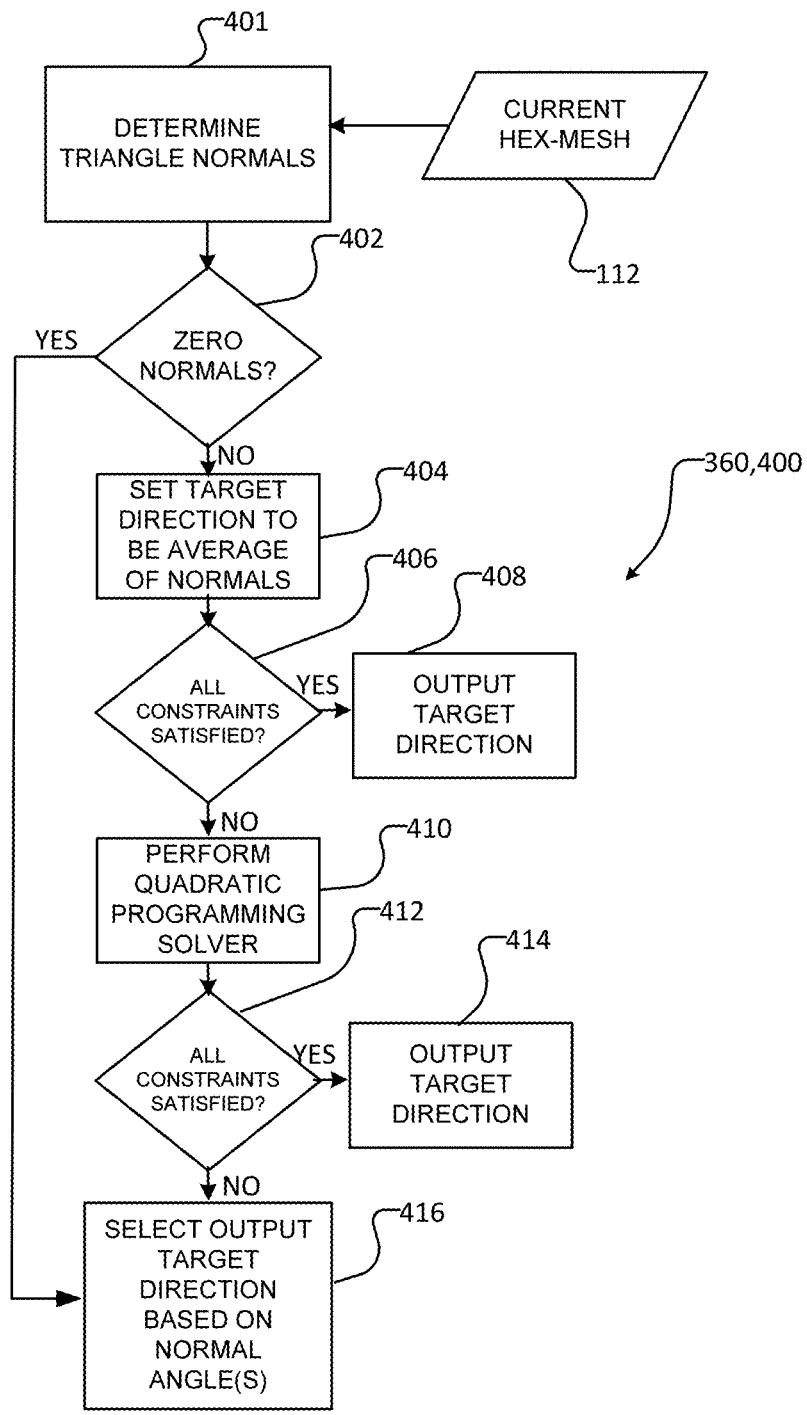
FIG. 5 is a schematic illustration of an automated (computer-implemented) method which may be used to implement the FIG. 4 local procedure according to an example embodiment.

FIG. 5 schematically illustrates a method 400 which may be used to implement the block 360 local procedure according to an example embodiment. Method 400 shown in FIG. 5 is implemented once for each directed edge $e_{ij}$ in current hex-mesh 112 and may be based on the characteristics of the edge-cone corresponding to the directed edge $e_{ij}$. Method 400 commences with block 401 which involves determining the triangle normals $n_k$ for each base triangle of the current directed edge based on current hex mesh 112. The determination of the base triangle normals $n_k$ for the current directed edge in block 401 may be similar to block 152 of method 150A described above and may be based on equation (4) or equation (6) suitably modified for application to a single directed edge. Method 400 then proceeds to the block 402 inquiry as to whether any of the base triangle normals $n_k$ corresponding to the current directed edge have zero length. If there are base triangle normals with zero length, then the block 402 inquiry is positive, and method 400 proceeds via the block 402 YES branch to block 416 discussed further below. Otherwise, method 400 proceeds via the block 402

NO branch to block 404, where the target direction $\hat{n}_{ij}$ is set to be the average of the base triangle normals (e.g. the unconstrained solution to equation (9)). Method 400 then proceeds to block 406 which involves an inquiry into whether the block 404 target direction $\hat{n}_{ij}$ satisfies the applicable non-inversion constraints (e.g. constraints having the form of equations (10) and (11)). If the block 406 inquiry is positive, then the block 404 target direction $\hat{n}_{ij}$ is output in block 408. If, on the other hand, the block 406 inquiry is negative, then method 400 proceeds to block 410 which involves implementing a quadratic programming solver to attempt to solve the constrained optimization problem (e.g. having the form of equations (9), (10) and (11)) to obtain a target direction $\hat{n}_{ij}$. Method 400 then proceeds to block 412 which involves an inquiry into whether the block 410 quadratic programming solver obtained a target direction $\hat{n}_{ij}$ that satisfies the non-inversion constraints. If the block 412 inquiry is positive, then the block 420 target direction $\hat{n}_{ij}$ is output in block 414. If, on the other hand, the block 412 inquiry is negative, then method 400 proceeds to block 416. Block 416 can be reached via the block 402 YES branch or the block 412 NO branch. Block 416 may involve selecting the output target direction $\hat{n}_{ij}$ to be one of: the current edge direction (e.g. the direction of $e_u$ in current hex-mesh 112) or the average of the base triangle normals $n_k$ (e.g. the unconstrained minimizer of equation (9) or the block 404 target direction $\hat{n}_{ij}$). As discussed above, in some embodiments, the particular one of the target directions $\hat{n}_{ij}$ chosen in block 416 may be based on the largest angle $\alpha_{ij}$ between the direction of the proposed output target direction $\hat{n}_{ij}$ and the base triangle normals $n_k$. In some embodiments, block 416 comprises selecting the output target directions $\hat{n}_{ij}$ to be the direction for which this angle $\alpha_{ij}$ is the smallest.

Referring back to FIG. 4, the block 360 local procedure outputs target edge directions $\hat{n}_{ij}$, 362 for each directed edge $e_{ij}$ in current hex-mesh 112. Method 360 then proceeds to the global procedure in block 370. In some embodiments, the block 370 global procedure may comprise an iterative optimization procedure which determines new vertex positions $v_i$ (e.g. globally for current mesh 112) that attempt to align the directed edges $e_{ij}$ of current mesh 112 with the block 360 target directions $\hat{n}_{ij}$. Rather than using hard non-inversion constraints (which may result in a premature termination of the optimization procedure similar to that discussed above in connection with method 100), the block 370 global procedure may use penalty functions between successive iterations which may keep the block 370 vertex positions (in each iteration) relatively close to the block 360 target directions $\hat{n}_{ij}$. The use of penalty functions in block 370 may permit the block 370 optimization to proceed to the next iteration in cases where the non-inversion constraints cannot be immediately satisfied.

Block 370 may use an energy function $E_{global}$ based on one of equations (1a) or (1b) describe above and may be augmented by a penalty term as discussed in more detail below. In some embodiments, the block 370 energy function may have the form:

$$E_{global} = \hat{E} + \Sigma_i W_i^P E_i^P \quad (13)$$

Where: $\hat{E}$ is the desired energy function, but for the penalty term (e.g. the right hand side of one of equations (1a) or (1b), with the possible addition of other terms as described in more detail below); $W_i^P$ are individual penalty weights; and $E_i^P$ are weighted penalty terms. Block 370 may apply per-edge-cone (or per directed edge) penalty terms aimed to keep the edge directions determined in each iteration of the block 370 global procedure sufficiently close to the bock 360 target directions $\hat{n}_{ij}$. In some embodiments, the block 370 penalty formulation is based on the observation that the norm of the difference between unit-length vectors is above unity when the angle between the unit length vectors is obtuse, and less than one, when the two unit-length vectors are relatively close (under 60°). Thus for larger angles, a high order monomial of this norm may serve as a penalty whose cost increases dramatically as the angle increases, strongly discouraging any solution where the new edge directions deviate far enough from the target to the point where a tetrahedron in an edge-cone becomes inverted. At the same time, the maximal distance between unit-length vectors is 2, providing a natural upper bound on the size of the penalty. With this formulation, the block 370 penalty scheme will terminate, as the penalties may not increase indefinitely.

In some embodiments, to keep the optimized energy function $E_{global}$ quadratic, block 370 may comprise separating a penalty monomial into a quadratic term, which we treat as a penalty function $$E_{ij}^P = \left\| \frac{e_{ij}}{\hat{L}_{ij}} - \hat{n}_{ij} \right\|^2 \quad (14)$$

and a higher order higher-order weight term $w_{ij}^P$ which is updated between penalty iterations within block 370 and which, in some embodiments, is never decreased. Determination of the normalization factors $\hat{L}_{ij}$ is described in more detail below. In some embodiments, the weights $w_{ij}^P$ are initially set to 1. After a solution to a particular iteration within block 370 is obtained, block 370 may comprise updating the penalty weights $w_{ij}^P$ by setting $$w_{ij}^P = \max\left(w_{ij}^P, \left\| \frac{e_{ij}}{\hat{L}_{ij}} - \hat{n}_{ij} \right\|^6 \right) \quad (16)$$

The choice of the exponent being six in equation (16) is empirical and not mandatory. The inventors have found that lower values for this exponent did not sufficiently penalize large angular deviations from the block 360 desired directions $\hat{n}_{ij}$, leading to decreases in solution quality, while larger exponents reduced numeric stability (e.g. because increasing the exponent increases the ratio between the largest and smallest elements of the gradient matrix of the block 370 energy function, which in turn increases its condition number).

When selecting the normalization factors $\hat{L}_{ij}$, focusing on angle only involves considering a pure directional difference—e.g. normalizing each directed edge of current hex-mesh 112 by its length at the beginning of the block 370 global procedure. In some circumstances, this choice may be sub-optimal (e.g. if the edge-length of a directed edge in current hex-mesh 112 is significantly different from its estimated target edge length (e.g. its block 320 target edge length), as the edge-length of current hex-mesh 112 may be a poor predictor of the edge-length after the block 370 optimization which is expected to get closer to its target edge length. In some embodiments, block 370 comprises anticipating this change in edge-length by, for each edge, setting $$\hat{L}_{ij} = \frac{\|e_{ij}\| + L_{ij}}{2},$$

where $\|e_{ij}\|$ is the edge-length of the edge in current hex-mesh 112 and $L_{ij}$ is the block 320 estimated target edge length discussed elsewhere in this description.

In some embodiments, block 370 also involves recognizing that the degree to which an edge $e_{ij}$ and its block 360 target direction $\hat{n}_{ij}$ should be aligned may depend on the geometry of the edge-cones determined in the block 360 local procedure. Specifically, block 370 may comprise considering the largest angle $\alpha_{ij}$ between the block 360 target direction $\hat{n}_{ij}$ and the corresponding edge-cone's base triangle normal $n_k$ used in block 360. To minimize (or reduce) the likelihood of inversion in block 370, when $\alpha_{ij}$ is below 90°, the edge $e_{ij}$ determined in each iteration of block 370 and the block 360 target direction $\hat{n}_{ij}$ should be more aligned as the angle $\alpha_{ij}$ grows. In some embodiments, therefore, block 370 comprises multiplying the weights $w_{ij}^P$ by a function that penalizes deviation between the edge $e_{ij}$ determined in each iteration of block 370 and the block 360 target direction $\hat{n}_{ij}$ more significantly as the angle $\alpha_{ij}$ grows. In some embodiment, block 370 comprises multiplying the weights $w_{ij}^P$ by a function of the angle $\alpha_{ij}$. In one particular embodiment, block 370 comprising multiplying the weights $w_{ij}^P$ by a function having the form $$W(\alpha_{ij}) = 1 + 10 e^{\frac{-\cos\alpha_{ij}^2}{2\sigma^2}} \quad (17)$$

In some embodiments, $\sigma$ is set at $\sigma=0.3$ using the three sigma rule for the weight to drop to 1 when the angle $\alpha_{ij}$ is zero, allowing for larger deviation.

In some embodiments, the block 370 global procedure may comprise iterative optimizing a quadratic energy function having the form:

$$E_{global} = \hat{E} + \Sigma_{ij} W(\alpha_{ij}) w_{ij}^P E_{ij}^P \quad (18)$$

where: $\hat{E}$ is the desired energy function, but for the penalty term (e.g. the right hand side of one of equations (1a) or (1b), with the possible addition of other terms as described in more detail below); $W(\alpha_{ij}) w_{ij}^P$ are individual penalty weights; and $E_i^P$ are weighted penalty terms. Block 370 may comprise iteratively repeating the optimization (e g minimizing equation (18)) with the current penalty weights and then updating the penalty weights $W(\alpha_{ij}) w_{ij}^P$ until the vertex positions $v_i$ and/or the combined energy function (e.g. equation (18)) no longer change or change less than a suitable threshold amount. Note that, as expected from penalty terms, the weights $W(\alpha_{ij}) w_{ij}^P$ do not decrease between iterations. It will also be appreciated that, in some embodiments, the block 370 penalties are applied to a particular edge $e_{ij}$ only if the block 360 target directions $\hat{n}_{ij}$ satisfy the non-inversion inequalities in block 360 (corresponding to $\alpha_{ij}=90°$). If the non-inversion constraints are not satisfied for a particular edge $e_{ij}$, then that particular edge may be omitted from penalties (e.g. omitted from the summation term of equation (18)). This can be appreciated on the basis that block 370 should only penalize changes from target directions corresponding to non-inverted conditions, and changes from inverted conditions should be welcomed.

Figure 6:
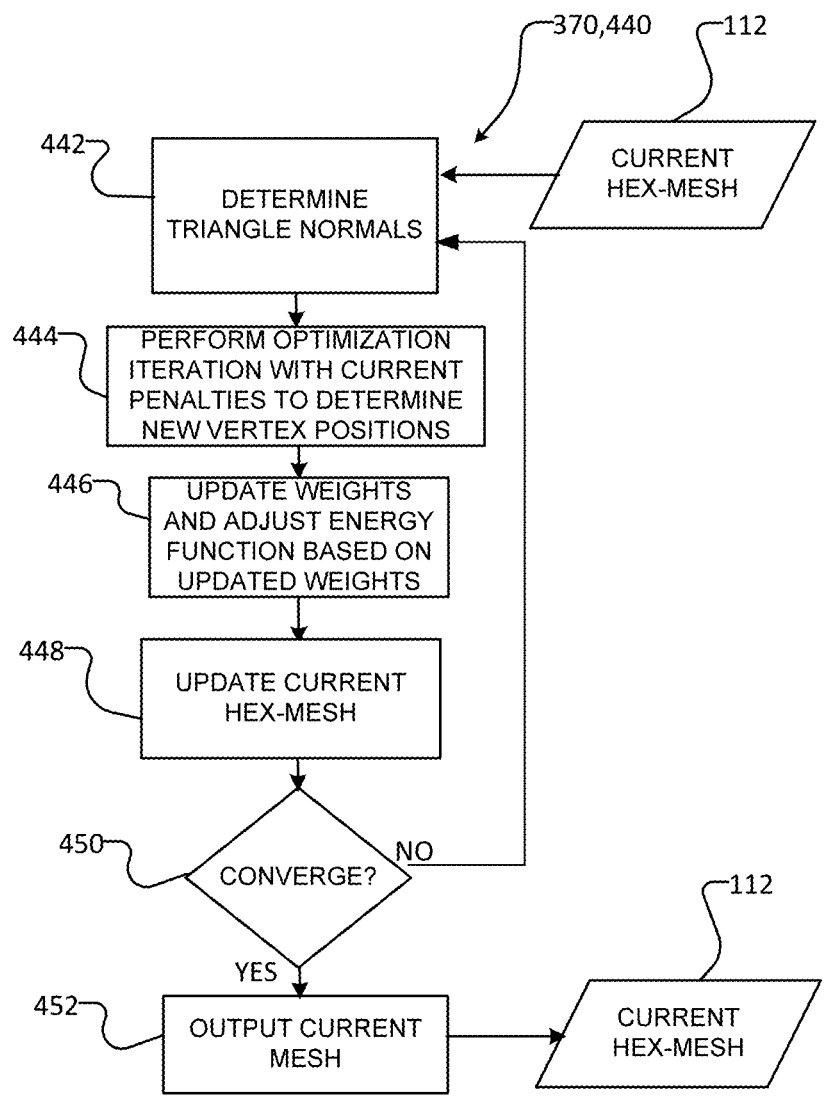
FIG. 6 schematically illustrates an automated (computer-implemented) method which may be used to implement the FIG. 4 global procedure according to an example embodiment.

FIG. 6 schematically illustrates a method 440 which may be used to implement the block 370 global procedure according to an example embodiment. Method 440 shown in FIG. 6 is implemented globally, which may be, but need not necessarily be, performed over the entire current mesh 112 and/or which may be performed over a suitable portion of current mesh 112 comprising a plurality of edge-cones.

Method 440 commences in block 442 which comprises determining the base triangle normal vectors $n_k$ for each directed edge $e_{ij}$ in current mesh 112. In some embodiments, these base triangle normals may already be known (e.g. from procedures performed in block 360). Method 440 then proceeds to block 444 which comprises performing an iteration of the optimization using the current penalty weights (e.g. $W(\alpha_{ij}) w_{ij}^P$). As discussed above, in some embodiments, the initial penalties may be set to unity on the first iteration of method 440 and may be updated in each successive iteration of method 440. The block 444 optimization may comprise minimizing an energy function $E_{global}$ (which may have the form of equation (18)) to determine new vertex positions $v_i$. Method 440 may then proceed to block 446 which comprises determining new penalty weights (e.g. $W(a_{ij}) w_{ij}^P$). In some embodiments, the block 446 terms $w_{ij}^P$ may be determined using the block 444 new vertex positions and an equation having the form of equation (16). In some embodiments, the block 446 terms $W(\alpha_{ij})$ may be determined using the block 444 new vertex positions and an equation having the form of equation (17). Method 440 then proceeds to block 448 which involves updating the current hex-mesh 112 based on block 444 new vertex positions. This block 448 updated current mesh 112 (together with the block 446 updated weights) may be used for successive iterations of method 440. Method 440 then proceeds to block 450 which involves the evaluation of one or more loop-exit (convergence) criteria. In some embodiments, such block 450 convergence criteria may comprise, without limitation, evaluating whether the changes in the block 444 vertex positions $v_i$ (or equivalently changes in current mesh 112) between successive iterations are less than a suitable threshold, evaluating whether the changes in the combined energy function (e.g. equation (18)) between successive iterations are less than a suitable threshold, evaluating a threshold based on the number of iterations, evaluating a threshold based on some temporal criteria and/or the like. If the block 450 convergence criteria is not met, then method 440 loops back to block 442 with the block 448 updated current hex mesh 112 and the block 446 updated weights. If the block 450 convergence criteria is met, then method 440 proceeds to block 452, where current hex-mesh 112 is output as a result of method 440.

Returning back to FIG. 4, it can be seen that the current hex-mesh 112 is the output of block 370 prior to an evaluation of loop exit criteria in block 380. Block 380 involves evaluation of an overall loop exit criteria. The block 380 loop exit criteria may comprise, by way of non-limiting example, evaluating whether the changes in the vertex positions $v_i$ (or equivalently changes in current mesh 112) between successive iterations of mesh-optimization loop 330 are less than a suitable threshold, evaluating hard constraints (e.g. of the form of equation (8)), evaluating a threshold based on the number of iterations of mesh-optimization loop 330, evaluating a threshold based on some temporal criteria and/or the like. If the block 380 loop-exit criteria are not met, then method 300 loops again through the local/global optimizations of blocks 360, 370. If, however, the block 380 loop-exit criteria are met, then method outputs current hex-mesh 112 as output hex-mesh 158. Output hex-mesh 158 may have improved quality relative to input hex-mesh 102.

A number of optional procedures are now described which may be used in various embodiments and/or in various blocks of methods 100, 300.

Figure 7B:
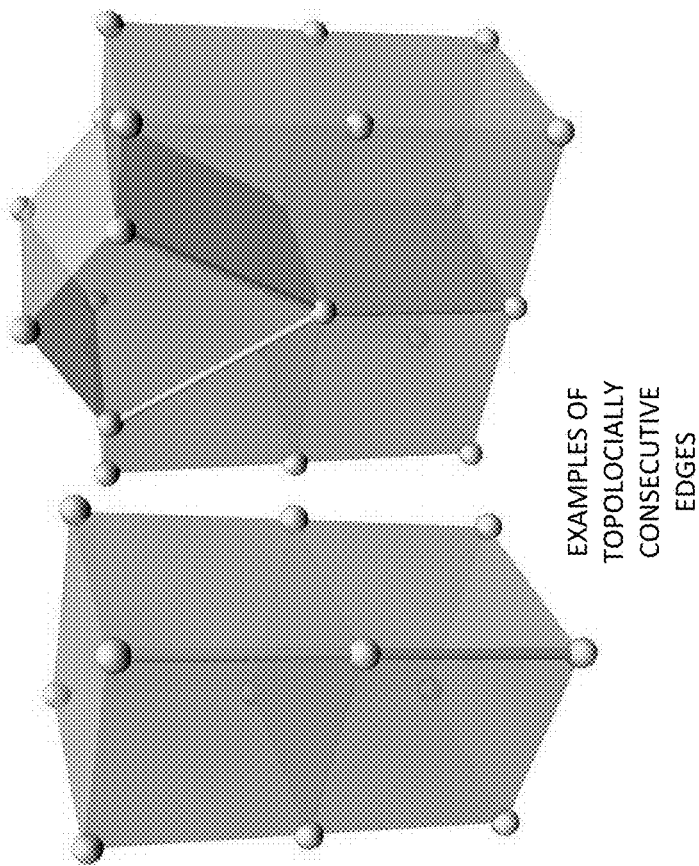
FIG. 7B shows a number of examples of topologically consecutive edges of neighboring hexahedra.
Figure 7A:
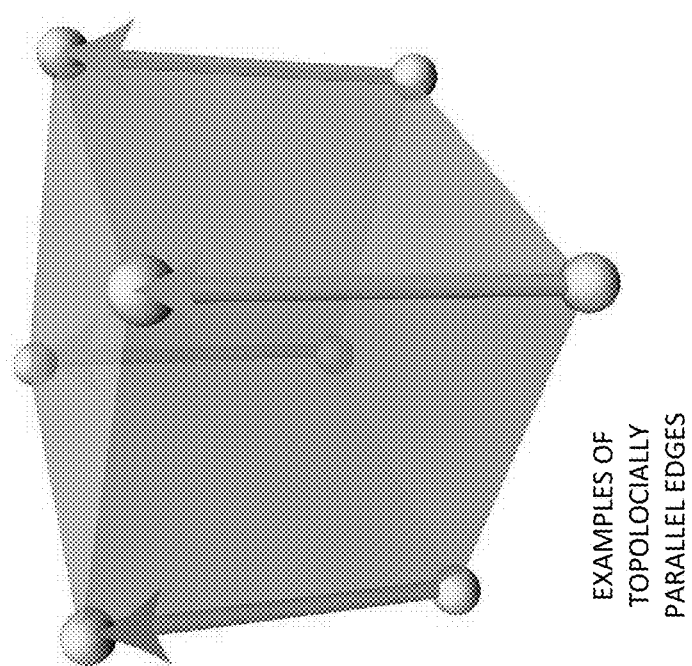
FIG. 7A shows an example of a number of topologically parallel edges of a hexahedron.

In some embodiments, the energy function $E_{global}$ described above may be augmented with a regularization term $E_{regularize}$ which may be aimed at generating more unified edge directions for adjacent mesh edges which leverages the structure of the hexahedral mesh. The regularization term $E_{regularize}$ may be added, for example, to the right hand side of equation (1a), (1b) and/or (18). The regularization term $E_{regularize}$ may form part of the term $\hat{E}$ in equation (18). It may be observed that for high quality hex-meshes, the directions of topologically parallel edges within the same hex (FIG. 7A) and of consecutive edges on face-adjacent hexes (FIG. 7B) are expected to be quite similar. Optimizing for direction similarity of such edges may help to guide the target edge directions across the mesh toward a more uniform solution, thereby improving the stability of the optimization process of methods 100, 300. Some embodiments employ a regularization term of the form:

$$E_{regularize} = \sum_{e \in E} \frac{1}{|P(e)|} \sum_{e_p \in P(e)} \left\| \frac{e}{L_e} - \frac{e_p}{L_p} \right\|^2 + \sum_{e \in E} \frac{1}{|C(e)|} \sum_{e_c \in C(e)} \left\| \frac{e}{L_e} - \frac{e_p}{L_p} \right\|^2 \quad (19)$$

where $e_p \in P(e)$ are the edges topologically parallel to a given edge $e$ and $e_c \in C(e)$ are its consecutive edges. In the equation (19) formulation, all vectors are normalized by target edge lengths $|L_e|, |L_p|, |L_c|$ to optimize for the desired length proportion.

A desirable feature in some mesh optimization applications and/or embodiments involves the preservation of the outer surface of the mesh (which may correspond to the outer surface of an object, for example). Some embodiments of methods 100, 300 may achieve this desirable feature by fixing the positions of the surface vertices. However, in some applications and/or embodiments, such strict positional constraints are too restrictive, as often mesh quality can be improved by allowing the surface vertices to slide along the boundary surface but without moving away from the boundary surface. Moreover, in some applications and/or embodiments, one cannot obtain an inversion-free mesh without allowing the mesh vertices to deviate from the boundary surface. Thus, in some embodiments, methods 100, 300 use a boundary formulation that balances surface preservation against mesh quality.

To optimize the quality of hexahedra along the boundary surface, some embodiments include partial cones around each surface edge. As the aim may be for surface edges to remain on the surface, the local step (e.g. block 360 of method 300) equation (9) may be modified for surface edges:

$$\hat{n}_{ij} = \underset{k=1}{\operatorname{argmin}} \sum^{|T(e_{ij})|} (\hat{n}_{ij} - n_k)^2 + \beta n_{ij} \cdot \check{n} \quad (20)$$

where: $\check{n}$ is the average of the original surface normals at $v_i$ and $v_j$; and $\beta$ is a configurable constant (e.g. $\beta=10$). The treatment of boundary edges in the global step (e.g. step 370 of method 300) may be similar to that of interior edges.

Expressing exact or approximate surface preservation in closed form (instead of just preserving the current locations) may involve the use of an analytic surface definition, which is typically rarely available. Thus to constrain vertices to remain on or close to the surface, some embodiments may employ a local surface approximation. Some embodiments may distinguish between regular surface vertices $v \in S$, feature vertices $v \in F$ and corners (vertices at the junction of multiple features) $v \in C$. To preserve the surface, some embodiments may use three types of per-vertex energy terms, selected by vertex type. Some embodiments may use a boundary energy term having the form:

$$E_{boundary} = \sum_{v \in S} \beta(\hat{n} \cdot v + \hat{d})^2 + \sum_{v \in F} \left( \alpha(v - (\hat{v} + a\hat{t}))^2 + a^2 \right) + \sum_{v \in C} \alpha(v - \hat{v})^2 \quad (21)$$

where: $\hat{v}$ is the reference, or closest, surface position for each vertex; $<\hat{n}, \hat{d}>$ is the implicit equation of the plane passing through $\hat{v}$ and orthogonal to the input surface normal $\hat{n}$ at that point; $\hat{t}$ is the feature tangent at $\hat{v}$; $a$ is an auxiliary variable added to the system to enable feature constraints; and $\alpha$ is a configurable constant for feature and corner weight. In some embodiments, $\alpha$ is set to $\alpha=20$. The equation (21) boundary term $E_{boundary}$ may be added, for example, to the right hand side of equation (1a), (1b) and/or (18). The equation (21) boundary term $E_{boundary}$ may form part of the term $\hat{E}$ in equation (18). It may be observed that the equation (21) boundary term $E_{boundary}$ is quadratic, thus augmenting the combined energy function $E_{global}$ with the equation (21) boundary term $E_{boundary}$ does not affect the convexity of the global optimization performed in methods 100, 300.

As discussed above, methods 100, 300 may make use of target, or optimal, edge lengths in a number of places in the formulation described above. Such target edge lengths may be determined in block 120 of method 100 and/or block 320 of method 300, for example. Such target edge lengths may be used in the remainder of method 100 and/or method 300. In many meshing frameworks, such target edge lengths are provided by users and may be based on simulation needs. Absent this high-level knowledge, when the mesh density is by design (or otherwise) non-uniform (e.g. for meshes created with octree-based methods), the input edge lengths provide a plausible estimation of the target edge length. If the mesh density is expected to be uniform, some embodiments may provide a better initial length estimate by leveraging the existing surface mesh sizing. In general, one expects mesh size changes to be gradual, indicating a preference for similar lengths on both topologically parallel and consecutive edges. Further, as a uniformly sized mesh is sought, the average edge length $L_A$ in the current mesh (which may be the input mesh) may serve as a good initial approximation of target interior mesh edge lengths. Some embodiments involve combining these observations to motivate an optimization having an edge-length energy function $E_{length}$ having the following formulation for obtaining target edge lengths $L_e$:

$$E_{length} = \Sigma_{e \in S'}(L_e - \|e\|^2)^2 + \Sigma_{e \in E/S'}(L_e - L_A)^2 + \Sigma_{e_p \in p(e)}(L_e - L_p)^2 + \Sigma_{e_c \in c(e)}(L_e - L_c)^2 \quad (22)$$

where: $e \in S'$ are the surface edges having both vertices on a boundary surface; $e \in E/S'$ are non-surface edges having at least one vertex that is not on a boundary surface; $e_p \in P(e)$ are the edges topologically parallel to $e$; $e_c$ EC ($e$) are the edges topologically consecutive to $e$; $\|e\|$ are original edge lengths; $L_A$ is the average edge length in the mesh; $L_p$ is the length of a a topologically parallel edge $e_p$; and $L_c$ is the length of a topologically consecutive edge $e_c$. Blocks 120 and/or 320 described above, may comprise optimizing (e.g. minimizing) an equation having the form of equation (22).

The resulting edge lengths $L_e$ balance the expectation of uniformity against the desire to preserve the current surface edge lengths. The resulting set of edge lengths $L_e$ determined in accordance with this edge-length optimization may be used as the target edge lengths $L_{ij}$ described at other locations herein.

In some embodiments, the overall hex-mesh optimization (e.g. of method 100 and/or method 300) can start with these target edge-lengths (e.g. by estimating same in blocks 120 and/or 320). In some embodiments, these target lengths can be updated selectively, reflecting the local mesh element quality, by linearly interpolating between the target edge lengths $L_e$ and current edge lengths $\|e\|$, $$L_e = (1-w) \cdot L_e + w\|e\| \quad (23)$$

where w is a Gaussian function of the smallest hex element minimal scaled jacobian (MSJ) q of any hex connected to the target edge:

$$w = e^{-0.5\left(\frac{q}{\sigma}\right)^2} \quad (24)$$

where $\sigma$ is a configurable constant (set, in some embodiments, to $\sigma=0:15$). This selective update aims to preserve the original target lengths in areas where the mesh quality is sufficiently high, so as to preserve the mesh in these areas as is, while updating edge lengths in areas where the quality is poor.

As discussed above, in some embodiments, the global energy function $E_{global}$ optimized in method 100 or in the global procedure 370 of method 300 may comprise a sum of some of the optional energy terms discussed above. In some embodiments, the global energy function $E_{global}$ optimized is given by equation (18), where the $\hat{E}$ term is given by:

$$\hat{E} = E_{cone} + E_{regularize} + E_{boundary} \quad (25a)$$

where: $E_{cone}$ has a form of equation (2) or equation (5), where $E_{regularize}$ has a form of equation (19) and $E_{boundary}$ has a form of equation (21). This yields a global energy function $E_{global}$ having the form:

$$E_{global} = E_{cone} + E_{penalty} + E_{regularize} + E_{boundary} \quad (25b)$$

where $E_{penalty}$ is the summation in the right hand side of equation (18). Since the minimized functional (the global energy function $E_{global}$) is quadratic, some embodiments make use of a standard linear solver (GMRES or SuperLU, for example) to compute the minimizer of equation (25). Once the iterations of the global procedure converge (e.g. iterative changes to the vertex positions $v_i$ or the energy value $E_{global}$ are less that a suitable threshold), some embodiments may optionally comprise repeating the hex-mesh optimization process (e.g. method 100 or method 300) with updated target edge lengths (as discussed above e.g. repeating method 100 and/or 300 with updates to the target edge lengths determined in optional block 120 and/or 320).

The framework described above is designed to obtain inversion-free meshes with high average element quality. However, some simulations have minimal, or worst, element quality restrictions that are more stringent than mere convexity. In some embodiments, the formulation described above aims for minimal angle between each directed edge and the base triangle normals of its associated edge-cone to be some configurable constant $\theta$ close to 90° (e.g. $\theta=85°$, in some embodiments) and uses $\varepsilon=\cos(\theta)$ in equation (10). In some embodiments, to achieve an improved minimum quality, a variation of the above-described techniques may be used to progressively improve the minimal quality of the resultant hex-mesh. In particular, some embodiments may comprise changes to equations (10) and (16) to achieve this result. Once all local solution spaces are not empty (i.e. all cone angles $\alpha_{ij}$ are below 90°, the default minimal angle threshold $\varepsilon$ (in equation (10)) may be replaced with a local threshold whose goal is to further improve the local cone-quality:

$$\hat{n}_{ij} \cdot n_k > \cos(\alpha_{ij} + \varepsilon) \text{ for all } t_k \in T(e_{ij}) \quad (26)$$

where $\alpha_{ij}$ is the worst current angle between the directed edge $e_{ij}$ and the normals of the base triangles of its corresponding edge-cone and $\varepsilon$ is some configurable constant (e.g. $\varepsilon=0.01$, in some embodiments). This change imposes a requirement that all directed edge target directions $\hat{n}_{ij}$ determined by the local procedure (block 360) be better aligned with respect to the normals of the base triangles of its corresponding edge-cone than they are using the above-described equation (10). In some embodiments, the above-described target direction $\hat{n}_{ij}$ may be kept if and when the equation (26) requirement results in an empty solution space. In some embodiments, no effort is made to improve the local cones if $\cos(\alpha_u)$ is above a suitably high-quality threshold (e.g. $\cos(\alpha_{ij}) > 0.5$).

Some embodiments also comprise determining the current worst angle w across all edge-cones. If this current worst angle value w is under 90°, the angle-based weight $W(\alpha_{eij})$ in the penalty function (equation (16)) may be updated to be maximized at this worst angle, $$W(\alpha_{eij}) = 1 + 10e^{\frac{-(\cos(\alpha_{ij}) - \cos(\omega))^2}{2\sigma^2}} \quad (27)$$

Mesh-optimization loop 330 (with these updates for maximizing minimal quality (e.g. equations (26) and (27))) may be performed, re-determining $\alpha_{ij}$ and w each time the process converges (e.g. for each iteration of mesh-optimization loop 330) and may be concluded when further improvement is no longer possible (e.g. w no longer increases) or once the minimal quality reaches a user-configurable minimal quality value.

Figure 8:
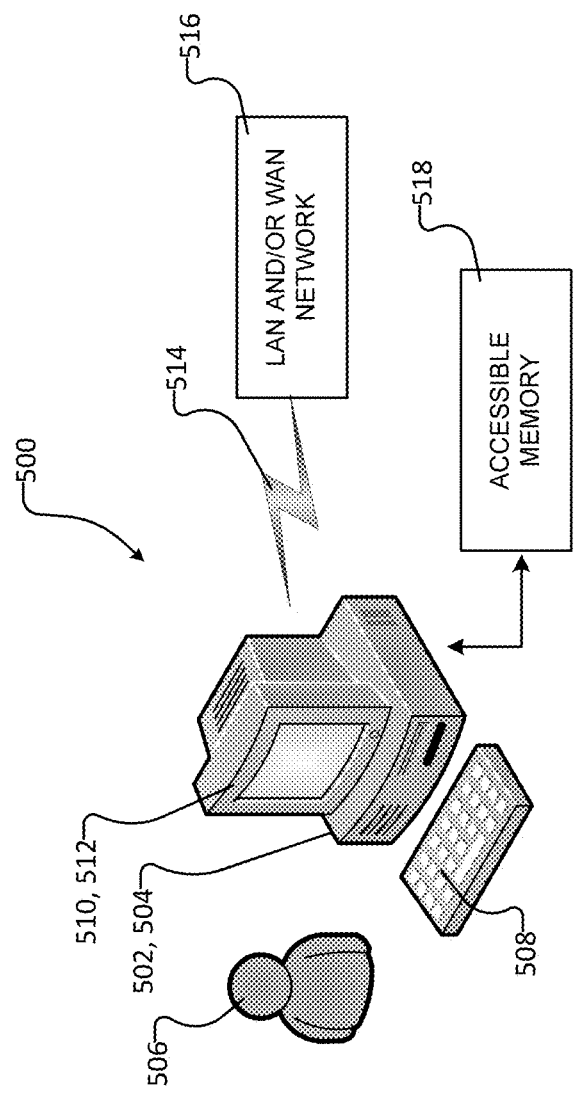
FIG. 8 is a schematic depiction of a system which may be used to perform any of the methods described herein according to a particular embodiment.

FIG. 8 is a schematic depiction of a system 500 which may be used to perform any of the methods described herein and the steps of any of the methods described herein according to a particular embodiment. System 500 of the illustrated embodiment comprises one or more computers 502 which may comprise one or more processors 504 which may in turn execute suitable software (not expressly enumerated) accessible to processor(s) 504. When such software is executed by computer 502 (and in particular processor(s) 504), computer 502 and/or processor(s) 504 may perform any of the methods described herein and the steps of any of the methods described herein. In the illustrated embodiment, computer 502 provides a user interface 510 for interaction with a user 506. From a hardware perspective, user interface 510 comprises one or more input devices 508 by which user 506 can input information to computer 502 and one or more output devices 512 by which information can be output to user 506. In general, input devices 508 and output devices 512 are not limited to those shown in the illustrated embodiment of FIG. 6. In general, input device 508 and output device 512 may comprise any suitable input and/or output devices suitable for interacting with computer 502. User interface 510 may also be provided in part by software when such software is executed by computer 502 and/or its processor(s) 504. In the illustrated embodiment, computer 502 is also connected to access data (and/or to store data) on accessible memory device 518. In the illustrated embodiment, computer 502 is also connected by communication interface 514 to a LAN and/or WAN network 516, to enable accessing data from networked devices (not shown) and/or communication of data to networked devices.

Input (e.g. input hex-mesh 102) may be obtained by computer 502 via any of its input mechanisms, including, without limitation, by any input device 508, from accessible memory 518, from network 516 or by any other suitable input mechanism. The outputs (e.g. output hex-mesh 158) may be output from computer 502 via any of its output mechanisms, including, without limitation, by any output device 512, to accessible memory 518, to network 516 or to any other suitable output mechanism. As discussed above, FIG. 8 is merely a schematic depiction of a particular embodiment of a computer-based system 500 suitable for implementing the methods described herein. Suitable systems are not limited to the particular type shown in the schematic depiction of FIG. 8 and suitable components (e.g. input and output devices) are not limited to those shown in the schematic depiction of FIG. 8.

The methods described herein may be implemented by computers comprising one or more processors and/or by one or more suitable processors, which may, in some embodiments, comprise components of suitable computer systems. By way of non-limiting example, such processors could comprise part of a computer-based automated contract valuation system. In general, such processors may comprise any suitable processor, such as, for example, a suitably configured computer, microprocessor, microcontroller, digital signal processor, field-programmable gate array (FPGA), other type of programmable logic device, pluralities of the foregoing, combinations of the foregoing, and/or the like. Such a processor may have access to software which may be stored in computer-readable memory accessible to the processor and/or in computer-readable memory that is integral to the processor. The processor may be configured to read and execute such software instructions and, when executed by the processor, such software may cause the processor to implement some of the functionalities described herein.

Certain implementations of the invention comprise computer processors which execute software instructions which cause the processors to perform a method of the invention. For example, one or more processors in a computer system may implement data processing steps in the methods described herein by executing software instructions retrieved from a program memory accessible to the processors. The invention may also be provided in the form of a program product. The program product may comprise any medium which carries a set of computer-readable signals comprising instructions which, when executed by a data processor, cause the data processor to execute a method of the invention. Program products according to the invention may be in any of a wide variety of forms. The program product may comprise, for example, physical (non-transitory) media such as magnetic data storage media including floppy diskettes, hard disk drives, optical data storage media including CD ROMs, DVDs, electronic data storage media including ROMs, flash RAM, or the like. The instructions may be present on the program product in encrypted and/or compressed formats.

Where a component (e.g. a software module, controller, processor, assembly, device, component, circuit, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

As will be apparent to those skilled in the art in the light of the foregoing disclosure, many alterations and modifications are possible in the practice of this invention without departing from the spirit or scope thereof. For example:

- This description uses the terms "global", "globally" as a matter of convenience to distinguish from operations that are "local" or performed "locally". Unless the context dictates otherwise, the terms "global" or "globally" should not be interpreted strictly to require that an operation performed globally is performed for every vertex and/or for every edge of a mesh. For example, in some cases, operations performed globally could include operations performed on an entirety of current mesh 112 or input mesh 102 (e.g. for every vertex and/or edge of the mesh), but this is not strictly necessary. In some embodiments, or applications, operations performed "globally" may be performed on a portion or portion(s) of current mesh 112 or input mesh 102 that includes a plurality of directed edges or a plurality of edge-cones. Similarly, in some embodiments, an object represented by an input mesh 102, an input mesh 102 and/or a current mesh 112 could be parsed into several portions, each of which could be treated as an input mesh 102 or a current mesh 112 on which operations could be performed globally. By way of non-limiting example, the methods described herein may be applied to problem portions of the mesh, while leaving non-problematic portions of the mesh unchanged.
- The above-described penalty terms represent only one form of penalty term that could be used in particular embodiments (e.g. with energy function of equation (18) and/or equation (25)). In other embodiments, other penalty terms/functions could be used. Such penalty functions may express a preference for directed edges being similar to the target directed edges determined in the local procedure.
- In some embodiments, block 120 or block 320 target edge lengths may be selected to be current edge lengths. Such embodiments may involve the use of a non-linear solver.

While a number of exemplary aspects and embodiments have been discussed above, those of skill in the art will recognize certain modifications, permutations, additions and sub-combinations thereof. It is therefore intended that the following appended aspects or claims and aspects or claims hereafter introduced are interpreted to include all such modifications, permutations, additions and sub-combinations.

What is claimed is:

1. A method, performed by a computer, for improving quality of a hex-mesh, the method comprising:
   obtaining an input hex-mesh;
   performing a first iterative procedure which starts with the input hex-mesh and which outputs an output hex-mesh having improved quality relative to the input hex-mesh;
   wherein performing the first iterative procedure comprises:
      initializing a current hex-mesh to be equal to the input hex mesh;

for each iteration of the first iterative procedure:
  performing an optimization of an energy function over a plurality of directed-edges in the current hex-mesh to determine updated vertex positions for vertices in the current hex-mesh, wherein for each directed edge, the energy function comprises a term that expresses a preference for the directed edge to be aligned with normal vectors of base triangles of an edge-cone corresponding to the directed edge; and
  updating the current hex-mesh with the updated vertex positions; and
  after one or more iterations, setting the output hex-mesh to be equal to the current hex-mesh;
wherein, for each directed edge extending from a base vertex $v_i$ to an end vertex $v_j$:
the edge-cone corresponding to the directed edge comprises a plurality of tetrahedra surrounding the directed edge, each of the plurality of tetrahedra bounded by the directed edge and by a pair of distinct edges of a hexahedron in the current hex-mesh, each of the pair of distinct edges emanating from the base vertex $v_i$ and not including the end vertex $v_j$;
the base triangles of the edge-cone corresponding to the directed edge comprise, for each tetrahedron of the plurality of tetrahedra, the triangular surface of the tetrahedron which includes the base vertex $v_i$ but does not include the end vertex $v_j$.

2. A method according to claim 1 wherein, for each directed edge $e_{ij}$ extending from the base vertex $v_i$ to the end vertex $v_j$, the term of the energy function that expresses the preference for the directed edge to be aligned with normal vectors $n_k$ of base triangles $t_k$ of the edge-cone corresponding to the directed edge $e_{ij}$ has the form of $$\sum_{t_k \in T(e_{ij})} \left( \frac{e_{ij}}{\|e_{ij}\|} - n_k \right)^2,$$

where $T(e_{ij})$ is a set of the base triangles $t_k$ of the edge-cone corresponding to the directed edge $e_{ij}$.

3. A method according to claim 1 comprising, for each directed edge $e_{ij}$ extending from the base vertex $v_i$ to the end vertex $v_j$, at least one of:
  determining the normal vectors $n_k$ of the base triangles $t_k$ corresponding to the directed edge $e_{ij}$ according to an equation having the form of $$n_k - \frac{(u_k - v_i) \times (u_{k+1} - v_i)}{\|(u_k - v_i) \times (u_{k+1} - v_i)\|} = 0, \forall e_{ij} \in \varepsilon, t_k \in T(e_{ij}),$$

where the base triangles $t_k$ comprise vertices $u_k$, $v_i$ and $u_{k+1}$, and where T is a set of the base triangles $t_k$; and
obtaining target edge lengths for the output hex-mesh and determining the normal vectors $n_k$ of the base triangles $t_k$ corresponding to the directed edge $e_{ij}$ according to an equation having the form of $n_k$ $$n_k - \frac{(u_k - v_i) \times (u_{k+1} - v_i)}{\|L_{k,i} \times L_{k+1,i}\|} = 0 \forall e_{ij} \in \varepsilon, t_k \in T(e_{ij})$$

where $L_{k,i}$ corresponds to a target edge length of an edge between vertices $u_k$ and $v_i$, and $L_{k+1,i}$ corresponds to a target edge length of an edge between vertices $u_{k+1}$ and $v_i$.

4. A method according to claim 3 wherein obtaining target edge lengths for the output hex-mesh comprises one or more of: receiving the target edge lengths for the output hex-mesh; using the edge-lengths of the input hex-mesh as the target edge lengths for the output hex-mesh;
  and estimating the target edge lengths for the output hex-mesh.

5. A method according to claim 4 wherein obtaining target edge lengths for the output hex-mesh comprises estimating the target edge lengths for the output hex-mesh and estimating the target edge lengths for the output hex-mesh comprises performing an edge-length optimization which optimizes an edge-length energy function over a plurality of edges in either the input hex-mesh or the current hex-mesh.

6. A method according to claim 5 where the edge-length energy function has the form of $E_{length} = \Sigma_{e \in S'}(L_e - \|e\|^2)^2 + \Sigma_{e \in E/S'}(L_e - L_A)^2 + \Sigma_{e_p \in P(e)}(L_e - L_p)^2 + \Sigma_{e_c \in C(e)}(L_e - L_c)^2$, where $e \in S'$ are surface edges having both vertices on a boundary surface, $e \in E/S'$ are non-surface edges having at least one vertex that is not on a boundary surface, $e_p \in P(e)$ are edges topologically parallel to e, $e_c \in C(e)$ are edges topologically consecutive to e, $\|e\|$ are original edge lengths, $L_A$ is an average edge length in the mesh, $L_p$ is a length of a topologically parallel edge $e_p$, $L_c$ is the length of a topologically consecutive edge $e_c$ and $L_e$ is a resulting edge length.

7. A method according to claim 1 wherein performing the optimization of the energy function comprises performing an iterative optimization and wherein, for each iteration of the iterative optimization, the energy function comprises, for each directed edge, a weighted penalty term which expresses a preference for the directed edge to be aligned with a target edge direction $\hat{n}_{ij}$.

8. A method according to claim 7 wherein, for each iteration of the iterative optimization, updating the weighted penalty term for each directed edge.

9. A method according to claim 7 wherein performing the first iterative procedure comprises, for each iteration of the first iterative procedure and for each directed edge, determining the target edge direction $\hat{n}_{ij}$.

10. A method according to claim 9 wherein, for each directed edge, determining the target edge direction $\hat{n}_{ij}$ is based on characteristics of the current hex-mesh local to the edge-cone corresponding to the directed edge.

11. A method according to claim 10 wherein, for each directed edge, the characteristics of the current hex-mesh local to the edge-cone corresponding to the directed edge are the normal vectors of the base triangles of the edge-cone corresponding to the directed edge and the positions of the vertices which define the directed edge.

12. A method according to claim 9 wherein, for each directed edge, determining the target edge direction $\hat{n}_{ij}$ comprises performing a local optimization which optimizes a local energy function comprising a plurality of local terms, each local term expressing a preference for the target edge direction $\hat{n}_{ij}$ to be aligned with a normal vector of a corresponding one of the base triangles of the edge-cone corresponding to the directed edge.

13. A method according to claim 9 wherein, for each directed edge, determining the target edge direction $\hat{n}_{ij}$ comprises:
  initially setting an initial target edge direction $\hat{n}_{ij}$ to correspond to the direction of an average of the normal vectors of the base triangles of the edge-cone corresponding to the directed edge;
evaluating whether the initial target edge direction $\hat{n}_{ij}$ satisfies non-inversion constraints; and
if the initial target edge direction $\hat{n}_{ij}$ satisfies non-inversion constraints, then determining the target edge direction $\hat{n}_{ij}$ to be the initial target edge direction $\hat{n}_{ij}$ and, otherwise, performing a local optimization which minimizes a local energy function which comprises a plurality of local terms, each local term expressing a preference for the target edge direction $\hat{n}_{ij}$ to be aligned with a normal vector of a corresponding one of the base triangles of the edge-cone corresponding to the directed edge.

14. A method according to claim 9 wherein, for each iteration of the iterative optimization, the weighted penalty term is based on the target edge direction $\hat{n}_{ij}$.

15. A method according to claim 14 wherein, for each directed edge, the weighted penalty term comprises a penalty function $E_{ij}^P$ which is optimized as part of the energy function and a penalty weight $w_{ij}^P$ that is updated between iterations of the second iterative optimization.

16. A method according to claim 15 wherein, for each directed edge, the penalty function $E_{ij}^P$ expresses the preference for the directed edge to be aligned with a target edge direction $\hat{n}_{ij}$.

17. A method according to claim 14 wherein, for each directed edge, the weighted penalty term comprises a geometry factor $W(\alpha_{ij})$ based at least in part on a largest angle $\alpha_{ij}$ between the target direction $\hat{n}_{ij}$ and the normal vectors of base triangles of the edge-cone corresponding to the directed edge.

18. A method according to claim 12 wherein, for each surface directed edge having both of its vertices on a surface boundary of the input mesh, performing the local optimization comprises optimizing a boundary-edge energy function which expresses a preference for the surface directed edge to remain on the surface boundary.

19. A method according to claim 8 wherein the energy function comprises a boundary preservation term $E_{boundary}$ which expresses a preference for vertices which are on a surface boundary of the input hex mesh to remain on the boundary surface.

20. A method, performed by a computer, for improving quality of a hex-mesh, the method comprising:
obtaining an input hex-mesh;
performing a first iterative procedure which starts with the input hex-mesh and which outputs an output hex-mesh having improved quality relative to the input hex-mesh;
wherein performing the first iterative procedure comprises:
initializing a current hex-mesh to be equal to the input hex mesh;
for each iteration of the first iterative procedure:
performing an optimization of an energy function over a plurality of directed-edges in the current hex-mesh to determine updated vertex positions for vertices in the current hex-mesh, wherein for each directed edge, the energy function comprises a term that expresses a preference for the directed edge to be aligned with normal vectors of base triangles of an edge-cone corresponding to the directed edge; and
updating the current hex-mesh with the updated vertex positions; and
after one or more iterations, setting the output hex-mesh to be equal to the current hex-mesh;
wherein performing the optimization of the energy function comprises performing an iterative optimization and wherein, for each iteration of the iterative optimization, the energy function comprises, for each directed edge, a weighted penalty term which expresses a preference for the directed edge to be aligned with a target edge direction $\hat{n}_{ij}$; and
wherein, for each iteration of the iterative optimization, the energy function comprises a parallel-edges regularization term $E_{regularize\_parallel}$, which expresses a preference for directions of topologically parallel edges of the same hexahedron to be the same.

21. A method, performed by a computer, for improving quality of a hex-mesh, the method comprising:
obtaining an input hex-mesh;
performing a first iterative procedure which starts with the input hex-mesh and which outputs an output hex-mesh having improved quality relative to the input hex-mesh;
wherein performing the first iterative procedure comprises:
initializing a current hex-mesh to be equal to the input hex mesh;
for each iteration of the first iterative procedure:
performing an optimization of an energy function over a plurality of directed-edges in the current hex-mesh to determine updated vertex positions for vertices in the current hex-mesh, wherein for each directed edge, the energy function comprises a term that expresses a preference for the directed edge to be aligned with normal vectors of base triangles of an edge-cone corresponding to the directed edge; and
updating the current hex-mesh with the updated vertex positions; and
after one or more iterations, setting the output hex-mesh to be equal to the current hex-mesh;
wherein performing the optimization of the energy function comprises performing an iterative optimization and wherein, for each iteration of the iterative optimization, the energy function comprises, for each directed edge, a weighted penalty term which expresses a preference for the directed edge to be aligned with a target edge direction $\hat{n}_{ij}$; and
wherein, for each iteration of the iterative optimization, the energy function comprises a consecutive-edges regularization term $E_{regularize\_consecutive}$, which expresses a preference for directions of topologically consecutive edges of face-adjacent hexahedra to be the same.

22. A method, performed by a computer, for improving quality of a hex-mesh, the method comprising:
obtaining an input hex-mesh;
performing a first iterative procedure which starts with the input hex-mesh and which outputs an output hex-mesh having improved quality relative to the input hex-mesh;
wherein performing the first iterative procedure comprises:
initializing a current hex-mesh to be equal to the input hex mesh;
for each iteration of the first iterative procedure:
performing an optimization of an energy function over a plurality of directed-edges in the current hex-mesh to determine updated vertex positions for vertices in the current hex-mesh, wherein for each directed edge, the energy function comprises a term that expresses a preference for the directed edge to be aligned with normal vectors of base triangles of an edge-cone corresponding to the directed edge; and
updating the current hex-mesh with the updated vertex positions; and
after one or more iterations, setting the output hex-mesh to be equal to the current hex-mesh;
wherein performing the optimization of the energy function comprises performing an iterative optimization and wherein, for each iteration of the iterative optimization, the energy function comprises, for each directed edge, a weighted penalty term which expresses a preference for the directed edge to be aligned with a target edge direction $\hat{n}_{ij}$;
wherein performing the first iterative procedure comprises, for each iteration of the first iterative procedure and for each directed edge, determining the target edge direction $\hat{n}_{ij}$;
wherein, for each directed edge, determining the target edge direction $\hat{n}_{ij}$ comprises performing a local optimization which optimizes a local energy function comprising a plurality of local terms, each local term expressing a preference for the target edge direction $\hat{n}_{ij}$ to be aligned with a normal vector of a corresponding one of the base triangles of the edge-cone corresponding to the directed edge; and
wherein, for each directed edge, performing the location optimization comprises performing the local optimization with first non-inversion constraints until the current mesh is free from inverted hexahedra and then switching the first non-inversion constraints to first quality-improvement constraints which require improved quality relative to previous iterations of the local optimization.

23. A method, performed by a computer, for improving quality of a hex-mesh, the method comprising:
obtaining an input hex-mesh;
performing a first iterative procedure which starts with the input hex-mesh and which outputs an output hex-mesh having improved quality relative to the input hex-mesh;
wherein performing the first iterative procedure comprises:
initializing a current hex-mesh to be equal to the input hex mesh;
for each iteration of the first iterative procedure:
performing an optimization of an energy function over a plurality of directed-edges in the current hex-mesh to determine updated vertex positions for vertices in the current hex-mesh, wherein for each directed edge, the energy function comprises a term that expresses a preference for the directed edge to be aligned with normal vectors of base triangles of an edge-cone corresponding to the directed edge; and
updating the current hex-mesh with the updated vertex positions; and
after one or more iterations, setting the output hex-mesh to be equal to the current hex-mesh;
wherein performing the optimization of the energy function comprises performing an iterative optimization and wherein, for each iteration of the iterative optimization, the energy function comprises, for each directed edge, a weighted penalty term which expresses a preference for the directed edge to be aligned with a target edge direction $\hat{n}_{ij}$;

wherein performing the first iterative procedure comprises, for each iteration of the first iterative procedure and for each directed edge, determining the target edge direction $\hat{n}_{ij}$;
wherein, for each iteration of the iterative optimization, the weighted penalty term is based on the target edge direction $\hat{n}_{ij}$; and
wherein, for each directed edge, the weighted penalty term comprises a geometry factor $W(\alpha_{ij})$ based at least in part on a largest angle $\alpha_{ij}$ between the target direction $\hat{n}_{ij}$ and the normal vectors of base triangles of the edge-cone corresponding to the directed edge; and
for each iteration of the first iterative process, determining a worst angle w from among the largest angles $\alpha_{ij}$ across the plurality of edge-cones corresponding to the plurality of directed edges in the current mesh, and if w is less than 90°, changing the geometry factor $W(\alpha_{ij})$ from a first geometry factor to a second geometry factor for subsequent iterations of the first iterative process, the second geometry factor different from the first geometry factor.

24. A system for improving quality of a hex-mesh, the system comprising:
one or more processors configured to:
obtain an input hex-mesh;
perform a first iterative procedure which starts with the input hex-mesh and which outputs an output hex-mesh having improved quality relative to the input hex-mesh;
wherein the one or more processors are configured to perform the first iterative procedure by:
initializing a current hex-mesh to be equal to the input hex mesh;
for each iteration of the first iterative procedure:
performing an optimization (e.g. minimization) of an energy function over a plurality of directed-edges in the current hex-mesh to determine updated vertex positions for vertices in the current hex-mesh, wherein for each directed edge, the energy function comprises a term that expresses a preference for the directed edge to be aligned with normal vectors of base triangles of an edge-cone corresponding to the directed edge; and
updating the current hex-mesh with the updated vertex positions; and
after one or more iterations, setting the output hex-mesh to be equal to the current hex-mesh;
wherein, for each directed edge extending from a base vertex $v_i$ to an end vertex $v_j$:
the edge-cone corresponding to the directed edge comprises a plurality of tetrahedra surrounding the directed edge, each of the plurality of tetrahedra bounded by the directed edge and by a pair of distinct edges of a hexahedron in the current hex-mesh, each of the pair of distinct edges emanating from the base vertex vi and not including the end vertex $v_j$;
the base triangles of the edge-cone corresponding to the directed edge comprise, for each tetrahedron of the plurality of tetrahedra, the triangular surface of the tetrahedron which includes the base vertex vi but does not include the end vertex $v_j$.

\* \* \* \* \*